(12) United States Patent
Moriya et al.

(10) Patent No.: US 8,957,356 B2
(45) Date of Patent: Feb. 17, 2015

(54) SYSTEM AND METHOD FOR GENERATING EXTREME ULTRAVIOLET LIGHT

(71) Applicant: Gigaphoton Inc., Oyama (JP)

(72) Inventors: Masato Moriya, Oyama (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 286 days.

(21) Appl. No.: 13/662,264

(22) Filed: Oct. 26, 2012

(65) Prior Publication Data

US 2013/0119232 A1    May 16, 2013

(30) Foreign Application Priority Data

Nov. 16, 2011   (JP) .................................. 2011-251037

(51) Int. Cl.

| | | |
|---|---|---|
| *G01J 1/20* | (2006.01) | |
| *H05G 2/00* | (2006.01) | |
| *G01J 1/42* | (2006.01) | |
| *G01J 1/04* | (2006.01) | |
| *G01J 9/00* | (2006.01) | |

(52) U.S. Cl.
CPC ............... *H05G 2/006* (2013.01); *H05G 2/008* (2013.01); *H05G 2/005* (2013.01); *G01J 1/4257* (2013.01); *G01J 1/0429* (2013.01); *G01J 9/00* (2013.01)
USPC ........................... 250/201.9; 355/68; 356/512

(58) Field of Classification Search
USPC ........................... 250/201.9, 548; 355/67–68; 356/512–515
See application file for complete search history.

(56) References Cited

U.S. PATENT DOCUMENTS

| | | | | |
|---|---|---|---|---|
| 7,230,220 | B2 * | 6/2007 | Lauer et al. ................. | 250/201.9 |
| 2006/0231731 | A1 * | 10/2006 | Lauer et al. ................. | 250/201.9 |
| 2011/0141865 | A1 | 6/2011 | Senekerimyan et al. | |

* cited by examiner

*Primary Examiner* — Seung C Sohn
(74) *Attorney, Agent, or Firm* — McDermott Will & Emery LLP

(57) ABSTRACT

A system for generating extreme ultraviolet light may include a chamber, a target supply device configured to supply a target material into the chamber, a laser apparatus configured to output a laser beam to irradiate the target material, a wavefront adjuster configured to adjust a wavefront of the laser beam, an imaging optical system configured to focus the laser beam reflected by the target material, an image detector configured to capture an image of the laser beam focused by the imaging optical system, and a controller configured to control the wavefront adjuster based on the captured image.

13 Claims, 25 Drawing Sheets

SYSTEM AND METHOD FOR GENERATING EXTREME ULTRAVIOLET LIGHT

CROSS-REFERENCE TO RELATED APPLICATION

The present application claims priority from Japanese Patent Application No. 2011-251037 filed Nov. 16, 2011.

BACKGROUND

1. Technical Field

The present disclosure relates to systems and methods for generating extreme ultraviolet (EUV) light.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

A system for generating extreme ultraviolet light according to one aspect of the present disclosure may include a chamber, a target supply device configured to supply a target material into the chamber, a laser apparatus configured to output a laser beam to irradiate the target material, a wavefront adjuster configured to adjust a wavefront of the laser beam, an imaging optical system configured to focus the laser beam reflected by the target material, an image detector configured to capture an image of the laser beam focused by the imaging optical system, and a controller configured to control the wavefront adjuster based on the captured image.

A system for generating extreme ultraviolet light according to another aspect of the present disclosure may include a beam path adjuster for controlling a beam path of a first laser beam and a beam path of a second laser beam to substantially coincide with each other, a wavefront adjuster provided in a beam path of the first laser beam upstream from the beam path adjuster, and a focusing optical system provided in a beam path of the first laser beam and the second laser beam downstream from the beam path adjuster.

A method for generating extreme ultraviolet light according to yet another aspect of the present disclosure in a system which includes a beam path adjuster for causing a beam path of a first laser beam and a beam path of a second laser beam to substantially coincide with each other, a wavefront adjuster provided in a beam path of the first laser beam upstream from the beam path adjuster, and a focusing optical system provided in a beam path of the first laser beam and the second laser beam downstream from the beam path adjuster and in which a target material is irradiated with the first laser beam to be turned into a diffused target and the diffused target is irradiated with the second laser beam may include obtaining an image of a backpropagating beam reflected by the target material and having passed through the focusing optical system and the wavefront adjuster, and adjusting the wavefront adjuster based on the obtained image.

BRIEF DESCRIPTION OF THE DRAWINGS

Hereinafter, selected embodiments of the present disclosure will be described with reference to the accompanying drawings.

DETAILED DESCRIPTION

Figure 1:
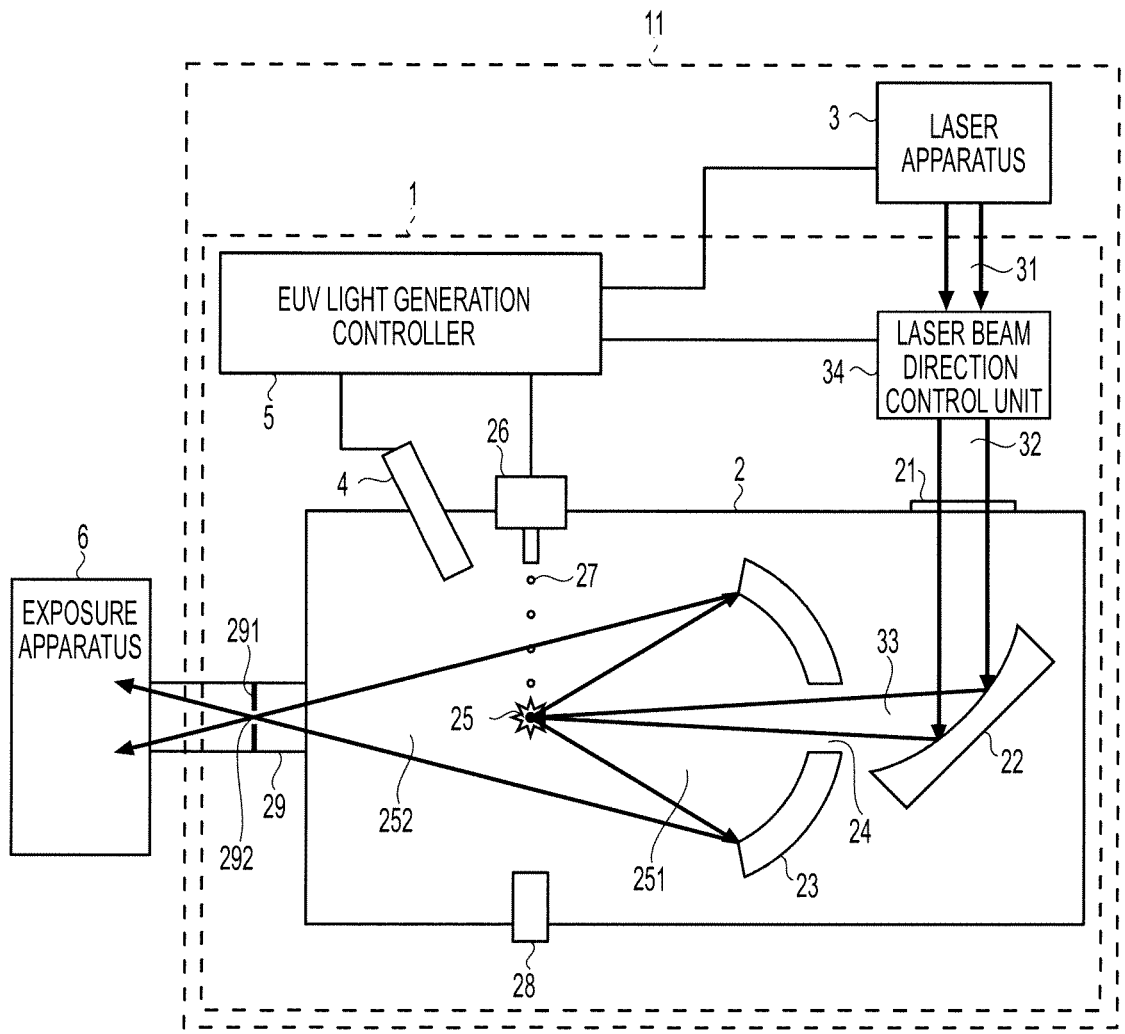
FIG. 1 schematically illustrates a configuration of an exemplary LPP type EUV light generation system.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein. The embodiments of the present disclosure will be illustrated following the table of contents below.

Contents
1. Overview of EUV Light Generation System
1.1 Configuration
1.2 Operation
2. EUV Light Generation System Including Optical Detector for Detecting Rays Reflected by Target: First Embodiment
2.1 Configuration
2.2 Operation
2.2.1 Image of Target Detected by Image Sensor
2.3 Effect
2.4 Flowcharts
2.4.1 EUV Light Generation Flow
2.4.2 Wavefront Adjusting Subroutine
2.4.3 Wavefront Adjusting Subroutine: Modification
2.4.4 Delay Time Adjusting Subroutine
2.4.5 Wavefront Stabilization Subroutine
2.4.6 Wavefront Stabilization Subroutine: Modification
3. EUV Light Generation System Including Optical Detector for Detecting Reflected Rays of Guide Laser Beam: Second Embodiment
3.1 Configuration
3.2 Operation
3.3 Effect
3.4 Flowcharts
3.4.1 EUV Light Generation Flow
3.4.2 Wavefront Adjusting Subroutine
3.4.3 Wavefront Adjusting Subroutine: Modification
3.4.4 Delay Time Adjusting Subroutine
3.4.5 Wavefront Stabilization Subroutine
3.4.6 Wavefront Stabilization Subroutine: Modification
4. EUV Light Generation Apparatus where Laser Beam Focusing Optical System Includes Lens: Third Embodiment
4.1 Configuration
4.2 Operation
4.3 Effect
4.4 Flowchart
4.4.1 EUV Light Generation Flow
5. Examples of Wavefront Adjuster
5.1 Combination of Spherical Convex Lens and Spherical Concave Lens
5.2 Combination of Two Spherical Convex Lenses
5.3 45-degree Incidence VRM
6. Examples of Optical Detector
6.1 Combination of Imaging Lens and Image Sensor
6.2 Shack-Hartmann Interferometer
7. Example of Laser Beam Focusing Optical System
7.1 Combination of Off-Axis Paraboloidal Mirror and Spheroidal Mirror
8. Additional Example 1. Overview of EUV Light Generation System 1.1 Configuration FIG. 1 schematically illustrates a configuration of an exemplary LPP type EUV light generation system. An EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation system 11 may include a chamber 2 and a target supply device 26. The chamber 2 may be sealed airtight. The target supply device 26 may be mounted onto the chamber 2, for example, to penetrate a wall of the chamber 2. A target material supplied by the target supply device 26 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may have a window 21, through which the pulse laser beam 32 may travel into the chamber 2. An EUV collector mirror 23 having a spheroidal surface may, for example, be provided in the chamber 2. The EUV collector mirror 23 may have a multi-layered reflective film formed on the spheroidal surface thereof. The reflective film may laminated. The EUV collector mirror 23 may have a first focus and a second focus, and may be positioned such that the first focus lies in a plasma generation region 25 and the second focus lies in an intermediate focus (IF) region 292 defined by the specification of an external apparatus, such as an exposure apparatus 6. The EUV collector mirror 23 may have a through-hole 24 formed at the center thereof, and a pulse laser beam 33 may travel through the through-hole 24 toward the plasma generation region 25.

The EUV light generation system 11 may further include an EUV light generation controller 5 and a target sensor 4. The target sensor 4 may have an imaging function and detect at least one of the presence, the trajectory, the position, and the speed of a target 27.

Further, the EUV light generation system 11 may include a connection part 29 for allowing the interior of the chamber 2 to be in communication with the interior of the exposure apparatus 6. A wall 291 having an aperture may be provided in the connection part 29, and the wall 291 may be positioned such that the second focus of the EUV collector mirror 23 lies in the aperture formed in the wall 291.

The EUV light generation system 11 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

1.2 Operation

With continued reference to FIG. 1, a pulse laser beam 31 outputted from the laser apparatus 3 may pass through the laser beam direction control unit 34 and be outputted therefrom as a pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target supply device 26 may be configured to output the target(s) 27 toward the plasma generation region 25 in the chamber 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of the timing at which the target 27 is outputted and the direction into which the target 27 is outputted. Furthermore, the EUV light generation controller 5 may be configured to control at least one of the timing at which the laser apparatus 3 oscillates, the direction in which the pulse laser beam 31 travels, and the position at which the pulse laser beam 33 is focused. It will be appreciated that the various controls mentioned above are merely examples, and other controls may be added as necessary.

2. EUV Light Generation System Including Optical Detector for Detecting Rays Reflected by Target First Embodiment An EUV light generation system according to a first embodiment of the present disclosure will now be described in detail with reference to the drawings. In the first embodiment, an EUV light generation system 11A in which a target material is irradiated with a series of laser beams will be illustrated as an example.

2.1 Configuration

Figure 2:
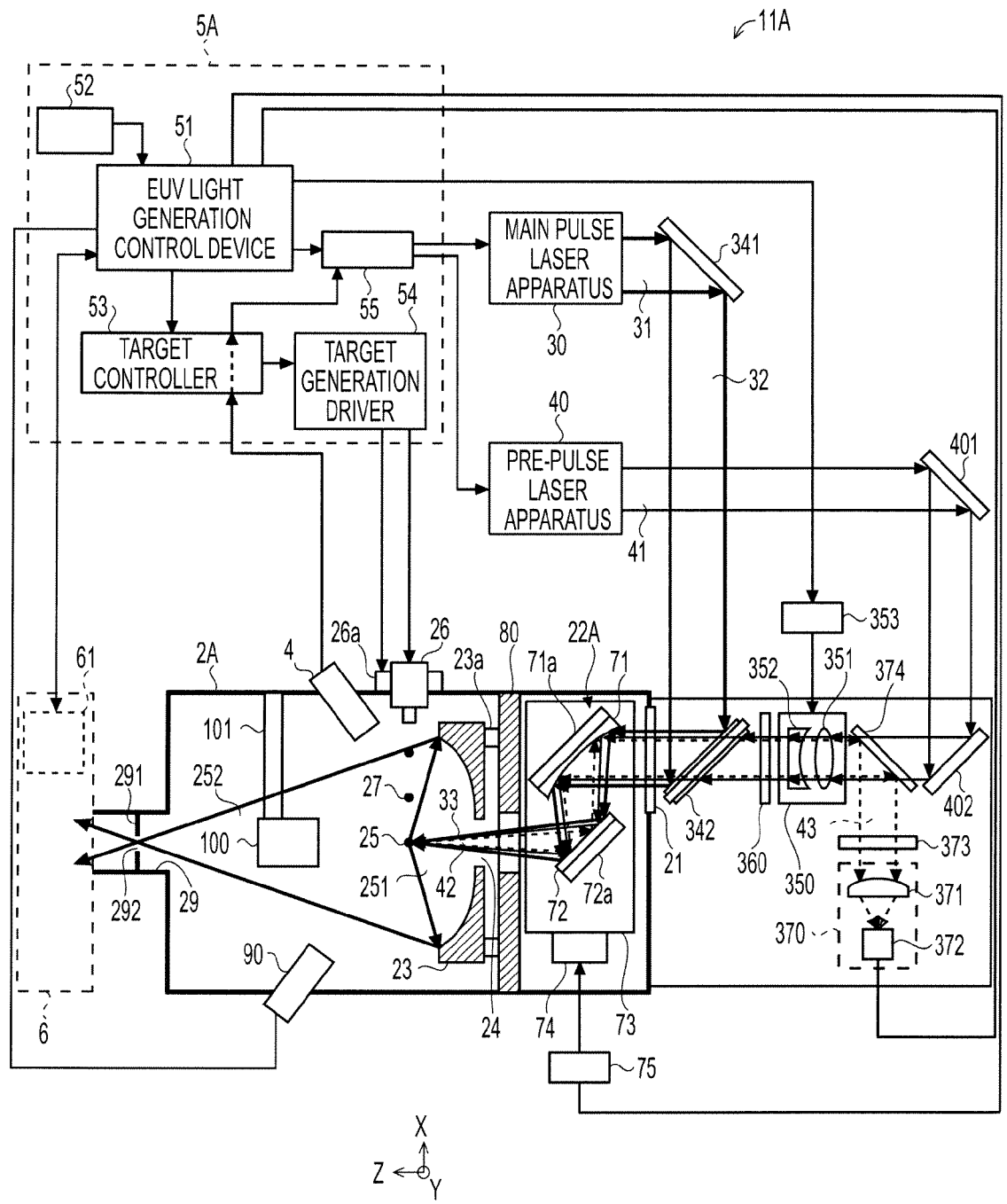
FIG. 2 schematically illustrates an exemplary configuration of an EUV light generation system according to a first embodiment of the present disclosure.

FIG. 2 schematically illustrates an exemplary configuration of the EUV light generation system 11A. As shown in FIG. 2, the EUV light generation system 11A may include a main pulse laser apparatus 30, a high-reflection mirror 341, a dichroic mirror 342, a pre-pulse laser apparatus 40, high-reflection mirrors 401 and 402, a wavefront adjuster 350, a quarter-wave plate 360, an optical detector 370, a polarization beam splitter 374, a chamber 2A, and an EUV light generation controller 5A.

A main pulse laser beam 31 outputted from the main pulse laser apparatus 30 may be reflected sequentially by the high-reflection mirror 341 and the dichroic mirror 342, and may enter the chamber 2A as a main pulse laser beam 32. The high-reflection mirror 341 and the dichroic mirror 342 may constitute a beam delivery unit. The high-reflection mirror 341 may be coated with a film configured to reflect the main pulse laser beam 31 with high reflectance. The beam delivery unit may further include an actuator (not separately shown) to adjust the position and/or the orientation of the high-reflection mirror 341.

The pre-pulse laser apparatus 40 may be configured to output a pre-pulse laser beam 41 at a central wavelength of approximately 1.06 μm. The pre-pulse laser apparatus 40 may be a yttrium aluminum garnet (YAG) laser apparatus. The pulse duration of the pre-pulse laser beam 41 may be approximately 5 ns. The pre-pulse laser beam 41 may be reflected sequentially by the high-reflection mirrors 401 and 402, and may enter the wavefront adjuster 350 through the polarization beam splitter 374. Each of the high-reflection mirrors 401 and 402 may be coated with a film configured to reflect the pre-pulse laser beam 41 with high reflectance. Each of the high-reflection mirrors 401 and 402 may include an actuator (not separately shown) to adjust the position and/or the orientation of each of the high-reflection mirrors 401 and 402.

The wavefront adjuster 350 may include a spherical convex lens 351 and a spherical concave lens 352. The wavefront adjuster 350 may also include a moving mechanism (not separately shown) for changing a distance between the spherical convex lens 351 and the spherical concave lens 352. The moving mechanism may move at least one of the spherical convex lens 351 and the spherical concave lens 352 in accordance with a drive signal from a driver 353. The pre-pulse laser beam 41 that has passed through the wavefront adjuster 350 may be transmitted through the quarter-wave plate 360 and be incident on the dichroic mirror 342.

The dichroic mirror 342 may serve as a beam combiner to adjust the beam axis of the main pulse laser beam 32 and the beam axis of the pre-pulse laser beam 41 prior to entering the chamber 2A. The dichroic mirror 342 may be positioned to bring the beam axis of the pre-pulse laser beam 41 transmitted therethrough to substantially coincide with the beam axis of the main pulse laser beam 32 reflected thereby. The dichroic mirror 342 may be coated on a first surface thereof with a film configured to reflect the main pulse laser beam 32 with high reflectance and transmit the pre-pulse laser beam 41 with high transmittance. Further, the dichroic mirror 342 may be coated on a second surface thereof with a film configured to transmit the pre-pulse laser beam 41 with high transmittance. The dichroic mirror 342 configured as such may be arranged so that the main pulse laser beam 32 is incident on the first surface thereof and the pre-pulse laser beam 41 is incident on the second surface thereof. The substrate of the dichroic mirror 342 may be formed of diamond.

The chamber 2A may include the window 21, a laser beam focusing optical system 22A, the target supply device 26, a two-axis moving mechanism 26a, the target sensor 4, the EUV collector mirror 23, an EUV monitor 90, a beam dump 100, and the connection part 29.

The main pulse laser beam 32 and the pre-pulse laser beam 41 that have entered the chamber 2A through the window 21 may enter the laser beam focusing optical system 22A. The window 21 may be coated with a film configured to reduce reflectance of a laser beam incident thereon. The laser beam focusing optical system 22A may include a laser beam focusing mirror 71 and a high-reflection mirror 72. The laser beam focusing optical system 22A may further include a moving plate 73, a plate moving mechanism 74, a mirror holder 71a, a holder 72a with an automatic tilt mechanism, and a driver 75. The laser beam focusing mirror 71 may be an off-axis paraboloidal mirror. The laser beam focusing mirror 71 may be fixed to the moving plate 73 through the mirror holder 71a. The high-reflection mirror 72 may be fixed to the moving plate 73 through the holder 72a. The plate moving mechanism 74 may be configured to move the laser beam focusing mirror 71 and the high-reflection mirror 72 together with the moving plate 73.

The main pulse laser beam 32 and the pre-pulse laser beam 41 that have entered the laser beam focusing optical system 22A may first be reflected by the laser beam focusing mirror 71 toward the high-reflection mirror 72. The high-reflection mirror 72 may reflect the main pulse laser beam 32 and the pre-pulse laser beam 41 to be focused in the plasma generation region 25 as a main pulse laser beam 33 and a pre-pulse laser beam 42, respectively.

The plate moving mechanism 74 may move the moving plate 73 to thereby adjust the focus position of the main pulse laser beam 33 and the focus position of the pre-pulse laser beam 42. The holder 72a may adjust the tilt angle of the high-reflection mirror 72 to thereby adjust the focus position of the main pulse laser beam 33 and the focus position of the pre-pulse laser beam 42. The plate-moving mechanism 74 and the holder 72a may be operated in accordance with respective drive signals from the driver 75. The driver 75 may output drive signals under the control of the EUV light generation controller 5A.

The target supply device 26 may be configured to output targets 27 in the form of droplets toward the plasma generation region 25. The two-axis moving mechanism 26a may move the target supply device 26 along the Y-Z plane to thereby adjust the position to which a target 27 is supplied. The target sensor 4 may be configured to detect the presence, the trajectory, the position, the speed, and the generation frequency of a target 27. The target sensor 4 may also be configured to detect a time at which a target 27 is present at a given position.

A target 27 that has reached the plasma generation region 25 may be sequentially irradiated with the pre-pulse laser beam 42 and the main pulse laser beam 33 through the through-hole 24 formed in the EUV collector mirror 23. Upon being irradiated with the pre-pulse laser beam 42, the target 27 may be turned into a diffused target. This diffused target may then be irradiated with the main pulse laser beam 33, and the diffused target may be turned into plasma. The light 251 including the EUV light 252 may be emitted from the plasma. The EUV collector mirror 23 may selectively reflect, of the light 251 incident thereon, the EUV light 252. The EUV light 252 reflected by the EUV collector mirror 23 may then be focused in the intermediate focus region 292 inside the connection part 29.

The pre-pulse laser beam 42 and the main pulse laser beam 33 that have passed through the plasma generation region 25 may be absorbed by the beam dump 100. The beam dump 100 may be fixed to the chamber 2A through a support 101.

The EUV monitor 90 may be configured to detect a position at which the EUV light 252 is generated within the plasma generation region 25. A detected position may then be sent to the EUV light generation controller 5A. Here, the EUV monitor 90 may also be configured to detect energy of the generated EUV light 252.

A part of the pre-pulse laser beam 42 that has struck the target 27 may be reflected by the target 27 as a backpropagating beam 43. The backpropagating beam 43 may travel through the laser beam focusing optical system 22A, the dichroic mirror 342, the quarter-wave plate 360, and the wavefront adjuster 350, and may be incident on the polarization beam splitter 374. The polarization beam splitter 374 may reflect the backpropagating beam 43 incident thereon. The reflected backpropagating beam 43 may enter the optical detector 370 through a wavelength filter 373. The wavelength filter 373 may transmit the backpropagating beam 43, which contains a component in the wavelength band of the pre-pulse laser beam 41, with high transmittance and absorb a component in other wavelength bands.

The optical detector 370 may include an imaging lens 371 and an image sensor 372. The backpropagating beam 43 that has entered the optical detector 370 may be imaged on the photosensitive surface of the image sensor 372 through the imaging lens 371. The image sensor 372 may then output image data of the backpropagating beam 43 to the EUV light generation controller 5A.

The EUV light generation controller 5A may include an EUV light generation control device 51, a reference clock generator 52, a target controller 53, a target generation driver 54, and a delay circuit 55. The EUV light generation control device 51 may be connected to the reference clock generator 52, the target controller 53, and an exposure apparatus controller 61 of the exposure apparatus 6. The EUV light generation control device 51 may further be connected to the main pulse laser apparatus 30 and the pre-pulse laser apparatus 40 through the delay circuit 55. The target controller 53 may be connected to the target sensor 4 and the target generation driver 54. The target generation driver 54 may be connected to the target supply device 26 and the two-axis moving mechanism 26a.

The interior of the chamber 2A may be divided into upstream and downstream spaces by a partition 80. The plasma generation region 25 may be set in the downstream space. The partition 80 may serve to reduce debris of the target material which is generated in the downstream space and enters the upstream space. The partition 80 may have a through-hole formed therein to allow the main pulse laser beam 33 and the pre-pulse laser beam 42 to pass therethrough toward the plasma generation region 25. The through-hole in the partition 80 may be aligned with the through-hole 24 in the EUV collector mirror 23. The EUV collector mirror 23 may be fixed to the partition 80 through a holder 23a.

2.2 Operation

An operation of the EUV light generation system 11A shown in FIG. 2 will now be described. The EUV light generation system 11A may operate under the control of the EUV light generation controller 5A.

The EUV light generation control device 51 may first receive from an external apparatus, such as the exposure apparatus controller 61, an EUV light generation signal requesting for generation of the EUV light 252 and a signal specifying a position at which the EUV light 252 is to be generated.

The EUV light generation control device 51 may then send a control signal to the target generation driver 54 so that a target 27 is outputted from the target supply device 26 and irradiated with the pre-pulse laser beam 42 at a desired position. The target generation driver 54 may send drive signals to the target supply device 26 and the two-axis moving mechanism 26a, respectively, in accordance with a control signal from the EUV light generation control device 51.

When a target 27 outputted from the target supply device 26 passes through a predetermined position, the target sensor 4 may detect a timing at which the target 27 passes through the predetermined position. A detection result by the target sensor 4 may be inputted to the delay circuit 55 through the target controller 53 as a passing timing signal.

The delay circuit 55 may set a delay time T1 relative to a passing timing signal so that a target 27 is irradiated with the pre-pulse laser beam 42. A trigger signal may be inputted to the pre-pulse laser apparatus 40 to control the pre-pulse laser apparatus 40 to oscillate at a timing delayed by a time equivalent to the delay time T1 with respect to a passing timing signal.

The delay circuit 55 may set a delay time T2 relative to a trigger signal for the pre-pulse laser beam 41 so that a diffused target generated as a target 27 is irradiated with the pre-pulse laser beam 42 is irradiated with the main pulse laser beam 33. A trigger signal may be inputted to the main pulse laser apparatus 30 to instruct the main pulse laser apparatus 30 to oscillate at a timing delayed by a time equivalent to the delay time T2 with respect to a trigger signal for the pre-pulse laser beam 41.

The delay times T1 and T2 set in the delay circuit 55 may be held in the EUV light generation control device 51.

When a trigger signal is inputted to the pre-pulse laser apparatus 40 through the delay circuit 55, the pre-pulse laser beam 41 may be outputted from the pre-pulse laser apparatus 40. The pre-pulse laser beam 41 may be linearly-polarized. The pre-pulse laser beam 41 may then be reflected sequentially by the high-reflection mirrors 401 and 402, and may be incident on the polarization beam splitter 374. Here, the polarization beam splitter 374 may be positioned so that the linearly-polarized pre-pulse laser beam 41 is incident thereon primarily as a P-polarization component.

The pre-pulse laser beam 41 which is incident on the polarization beam splitter 374 as a P-polarization component may be transmitted therethrough and may enter the wavefront adjuster 350. The wavefront adjuster 350 may operate under the control of the EUV light generation control device 51 to adjust the wavefront of the pre-pulse laser beam 41, if necessary. The pre-pulse laser beam 41 that has been outputted from the wavefront adjuster 350 may then be transmitted through the quarter-wave plate 360 to thereby be converted into a circularly polarized laser beam.

Then, the pre-pulse laser beam 41 may be transmitted through the dichroic mirror 342 and may enter the chamber 2A through the window 21. The pre-pulse laser beam 41 that has entered the chamber 2A may be reflected sequentially by the off-axis paraboloidal mirror 71 and the high-reflection mirror 72, and focused on a target 27 in the plasma generation region 25 as the pre-pulse laser beam 42.

When the pre-pulse laser beam 42 strikes a target 27, a part of the pre-pulse laser beam 42 may be reflected by the spherical surface of the target 27 as the backpropagating beam 43. The aforementioned reflected part may correspond to an initial part in a waveform of a pulse in the pre-pulse laser beam 42. The backpropagating beam 43 at this point may be circularly polarized.

The backpropagating beam 43 may be reflected sequentially by the high-reflection mirror 72 and the off-axis paraboloidal mirror 71, and transmitted through the dichroic mirror 342. Then, the backpropagating beam 43 may be transmitted through the quarter-wave plate 360 to thereby be converted into a linearly-polarized laser beam. The polarization state of the backpropagating beam 43 at this point may be such that the backpropagating beam 43 will be incident on the polarization beam splitter 374 primarily as an S-polarization component. The backpropagating beam 43 may then pass through the wavefront adjuster 350 and be reflected by the polarization beam splitter 374. Thereafter, the backpropagating beam 43 may be transmitted through the wavelength filter 373 with high transmittance. Here, the wavelength filter 373 may absorb or reflect rays at wavelengths other than that of the backpropagating beam 43.

The backpropagating beam 43 transmitted through the wavelength filter 373 may be focused by the imaging lens 371 and imaged on the photosensitive surface of the image sensor 372. Thus, an image of the backpropagating beam 43 may be formed on the photosensitive surface of the image sensor 372. Here, since the backpropagating beam 43 is a part of the pre-pulse laser beam 42 reflected by a target 27, the image of the backpropagating beam 43 may correspond to an image of the target 27 irradiated by the pre-pulse laser beam 42. The image sensor 372 may then output the obtained image to the EUV light generation control device 51 as image data.

Thereafter, the EUV light generation control device 51 may analyze inputted image data. The EUV light generation control device 51 may send a control signal to the driver 353 of the wavefront adjuster 350 based on an analysis result. More specifically, the EUV light generation control device 51 may send a control signal to the driver 353 to drive the wavefront adjuster 350 so that the pre-pulse laser beam 42 is focused at the position of the target 27. Thus, a subsequent target 27 will be brought into focus in an image to be obtained by the image sensor 372. The driver 353 may output a drive signal to the wavefront adjuster 350 in accordance with a received control signal.

2.2.1 Image of Target Detected by Image Sensor

Figure 3:
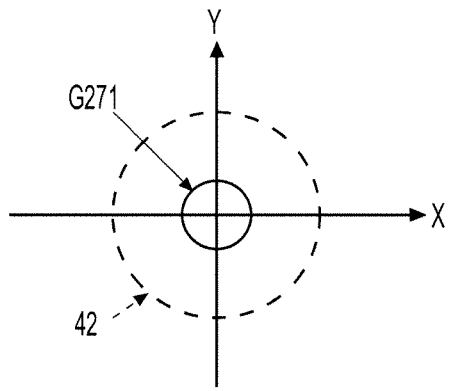
FIG. 3 shows an example of an image detected when a focal plane of a pre-pulse laser beam is offset in −Z direction with respect to the position of a target.
Figure 4:
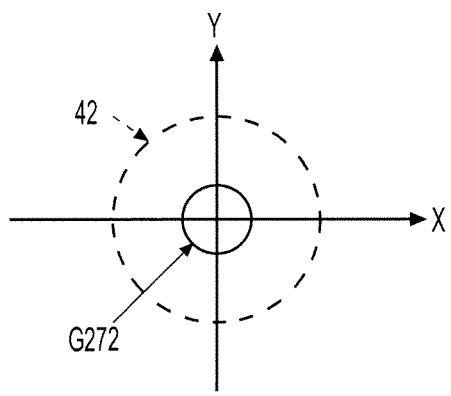
FIG. 4 shows an example of an image detected when a focal plane of a pre-pulse laser beam is offset in +Z direction with respect to the position of a target.
Figure 5:
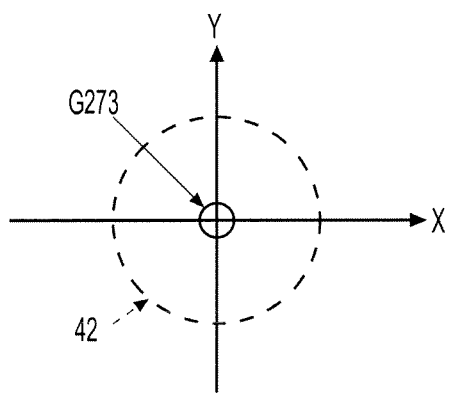
FIG. 5 shows an example of an image detected when a focal plane of a pre-pulse laser beam coincides with the position of a target.

FIGS. 3 through 5 show examples of an image detected by an image sensor. FIG. 3 shows an example of an image detected when a focal plane of the pre-pulse laser beam is offset in the −Z direction with respect to the position of a target. FIG. 4 shows an example of an image detected when a focal plane of the pre-pulse laser beam is offset in the +Z direction with respect to the position of a target. FIG. 5 shows an example of an image detected when a focal plane of the pre-pulse laser beam coincides with the position of a target. Here, the term "focal plane" may refer to a plane perpendicular to the beam axis of the pre-pulse laser beam 42 and containing the focus of the laser beam focusing optical system 22A.

As apparent from the comparison of FIGS. 3 through 5, when the focal plane of the pre-pulse laser beam 42 is offset in the +Z directions with respect to the position of the target 27, images G271 and G272 of the target 27 shown respectively in FIGS. 3 and 4 may be larger than an image G273 of the target 27 shown in FIG. 5, in which the target 27 is in focus. Here, as shown in broken lines in FIGS. 3 through 5, the spot size of the pre-pulse laser beam 42 may be sufficiently large with respect to size of the target 27.

When an image of a target 27 is out of focus, the EUV light generation control device 51 may control the wavefront adjuster 350 so that the pre-pulse laser beam 42 will be focused on a subsequent target 27 and thus an image of that target 27 will be smaller than the image of the current instance. Here, the EUV light generation control device 51 may control the wavefront adjuster 350 so that the size of an image of the subsequent target 27 detected by the image sensor 372 reaches the minimum.

2.3 Effect

An image of a target 27 illuminated by the pre-pulse laser beam 42 is detected, and the focus of the pre-pulse laser beam is adjusted accordingly. When the main pulse laser beam 31 and the pre-pulse laser beam 41 are focused at distinct wavelengths by a common optical system, it may be difficult to independently control the respective focuses to desired positions. Thus, in the first embodiment, by providing the wavefront adjuster 350 to adjust the wavefront of one of the laser beams in a beam path thereof, even when the laser beam focusing optical system 22A is commonly used, the two laser beams may be focused at distinct wavelengths respectively on a target 27 and on a diffused target with high precision.

2.4 Flowchart

An exemplary operation of the EUV light generation system 11A according to the first embodiment will now be described in detail with reference to the drawings.

2.4.1 EUV Light Generation Flow

Figure 6:
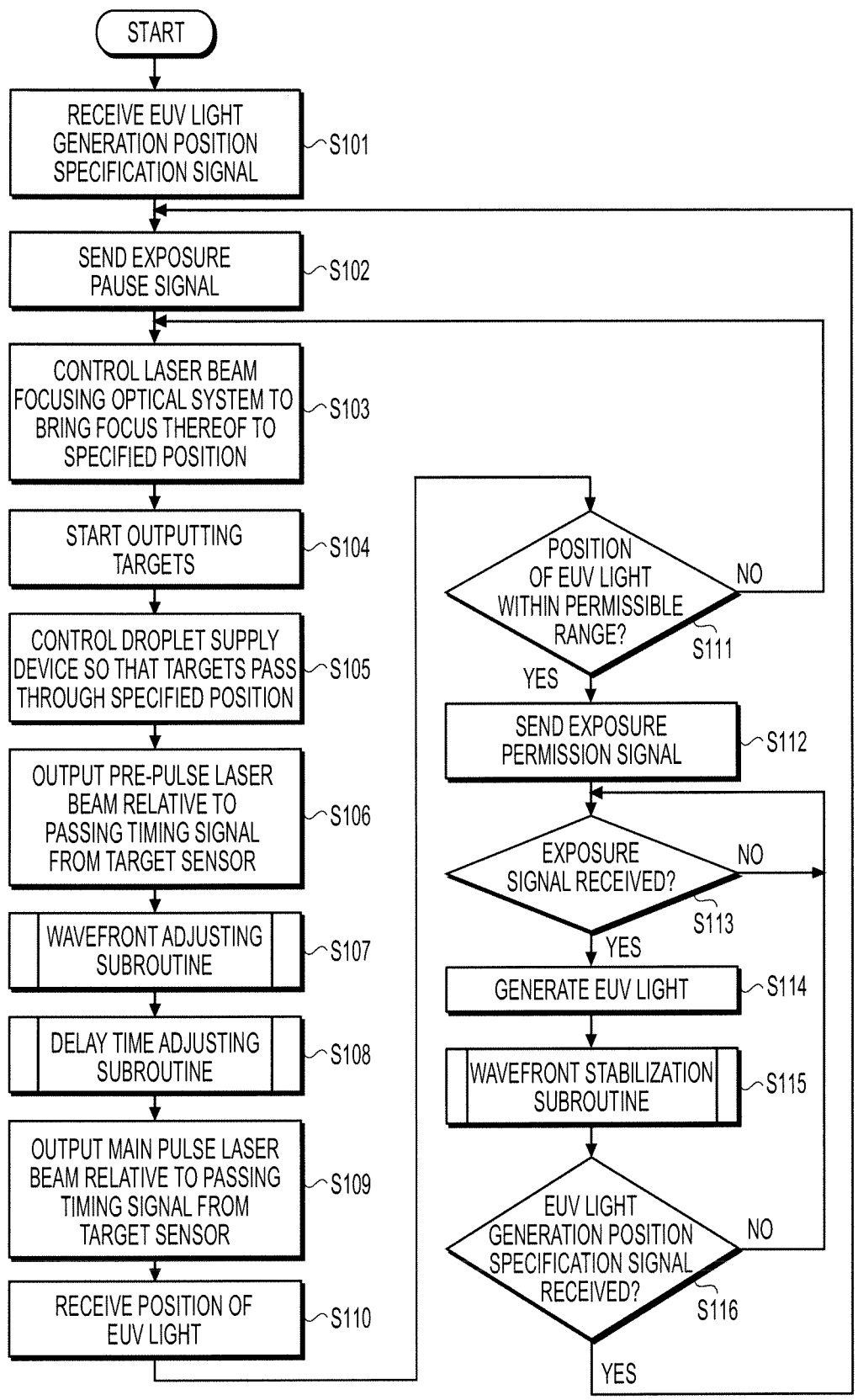
FIG. 6 is a flowchart showing an example of an overall operation of an EUV light generation controller according to the first embodiment.

FIG. 6 is a flowchart showing an example of an overall operation of an EUV light generation control device according to the first embodiment. With reference to FIG. 6, the EUV light generation control device 51 may first receive an EUV light generation position specification signal specifying a position at which the EUV light 252 is to be generated (Step S101). An EUV light generation position specification signal may be inputted to the EUV light generation control device 51 from an external apparatus such as the exposure apparatus controller 61. Alternatively, in place of an EUV light generation position specification signal, various other signals instructing or requesting exposure may be used. These signals may contain information to specify a position at which the EUV light 252 is to be generated.

Upon receiving an EUV light generation position specification signal, the EUV light generation control device 51 may send an exposure pause signal to the exposure apparatus controller 61 (Step S102). Then, the EUV light generation control device 51 may control the laser beam focusing optical system 22A through the driver 75 so that the focus of the laser beam focusing optical system 22A coincides with the position specified by the received EUV light generation position specification signal (Step S103). Along with this operation, the optical detector 370 may be adjusted so that the center of an image formed on the photosensitive surface of the image sensor 372 by the imaging lens 371 corresponds to the specified EUV light generation position in the plasma generation region 25.

Then, the EUV light generation control device 51 may control the target supply device 26 to start outputting targets 27 through the target controller 53 (Step S104). After Step S104, the target supply device 26 may continue to output targets 27 at a predetermined repetition rate until a pause signal is received.

Subsequently, the EUV light generation control device 51 may control the two-axis moving mechanism 26a to adjust the position of the target supply device 26 so that the targets 27 pass through the aforementioned specified position (Step S105). The adjustment in the position of the target supply device 26 may be carried out based on information including a trajectory of a target 27 detected by the target sensor 4.

Then, the EUV light generation control device 51 may control the pre-pulse laser apparatus 40 to output the pre-pulse laser beam 41 at a timing relative to a passing timing signal of a target 27 received from the target sensor 4 (Step S106). In Step S106, a trigger signal may be outputted from the EUV light generation control device 51 with an input of a passing timing signal serving as a reference. The trigger signal may be inputted to the pre-pulse laser apparatus 40 through the delay circuit 55 in which the delay time T1 for the pre-pulse laser beam 41 is set. Here, the target sensor 4 may detect targets 27 outputted at a predetermined repetition rate. Thus, the pre-pulse laser apparatus 40 may output the pre-pulse laser beam 41 at the predetermined repetition rate.

Thereafter, the EUV light generation control device 51 may carry out a wavefront adjusting subroutine to adjust a wavefront of the pre-pulse laser beam 41 (Step S107). Then, the EUV light generation control device 51 may carry out a delay time adjusting subroutine to adjust an irradiation timing of a target 27 with the pre-pulse laser beam 41 (Step S108). In the delay time adjusting subroutine, the delay times T1 and T2 set in the delay circuit 55 may be updated.

Then, the EUV light generation control device 51 may control the main pulse laser apparatus 30 to output the main pulse laser beam 31 at a timing relative to a passing timing signal of a target 27 received from the target sensor 4 (Step S109). In Step S109, a trigger signal may be outputted from the EUV light generation control device 51 with an input of a passing timing signal serving as a reference. The trigger signal may be inputted to the main pulse laser apparatus 30 through the delay circuit 55 in which the delay time T2 for the main pulse laser beam 31 is set.

Subsequently, the EUV light generation control device 51 may receive information on a position at which the EUV light 252 has been generated detected by the EUV monitor 90 (Step S110). Then, the EUV light generation control device 51 may determine whether or not the received position of the EUV light 252 falls within a permissible range (Step S111). At this point, the EUV light generation control device 51 may stop outputting trigger signals to the pre-pulse laser apparatus 40 and the main pulse laser apparatus 30, respectively, regardless of a determination result. Further, the EUV light generation control device 51 may control the target supply device 26 to stop outputting targets 27 through the target controller 53. The aforementioned permissible range may be set in advance or may be given from an external apparatus such as the exposure apparatus controller 61.

When the received position of the EUV light 252 does not fall within the permissible range (Step S111; NO), the EUV light generation control device 51 may return to Step S103 and repeat the subsequent steps. When the received position of the EUV light 252 falls within the permissible range (Step S111; YES), the EUV light generation control device 51 may send an exposure permission signal to the exposure apparatus controller 61 (Step S112). In response to the exposure permission signal, the exposure apparatus controller 61 may return an exposure signal indicating the start of exposure to the EUV light generation control device 51.

The EUV light generation control device 51 may stand by until it receives an exposure signal from the exposure apparatus controller 61 (Step S113; NO). Upon receiving an exposure signal (Step S113; YES), the EUV light generation control device 51 may output trigger signals to the pre-pulse laser apparatus 40 and the main pulse laser apparatus 30, respectively. Further, the EUV light generation control device 51 may control the target supply device 26 to output targets 27 through the target controller 53. Thus, the EUV light generation control device 51 may carry out an operation to generate EUV light 252 (Step S114). Then, the EUV light generation control device 51 may carry out a wavefront stabilization subroutine to stabilize the wavefront of the pre-pulse laser beam 41 (Step S115).

Subsequently, the EUV light generation control device 51 may determine whether or not it has received an EUV light generation position specification signal from the exposure apparatus controller 61 to reinstruct or modify a position at which the EUV light 252 is to be generated (Step S116). When an EUV light generation position specification signal has not been received (Step S116; NO), the EUV light generation control device 51 may return to Step S113 and repeat the subsequent steps. When an EUV light generation position specification signal has been received (Step S116; YES), the EUV light generation control device 51 may return to Step S102 and repeat the subsequent steps.

Through the above-described operation, the EUV light 252 may be generated while the focus of the pre-pulse laser beam 41 is stabilized. Accordingly, the EUV light 252 may be generated at a stable position and with stable intensity. Here, the operation shown in FIG. 6 may be terminated sequentially by interrupt processing through a signal indicating termination of exposure.

2.4.2 Wavefront Adjusting Subroutine

Figure 7:
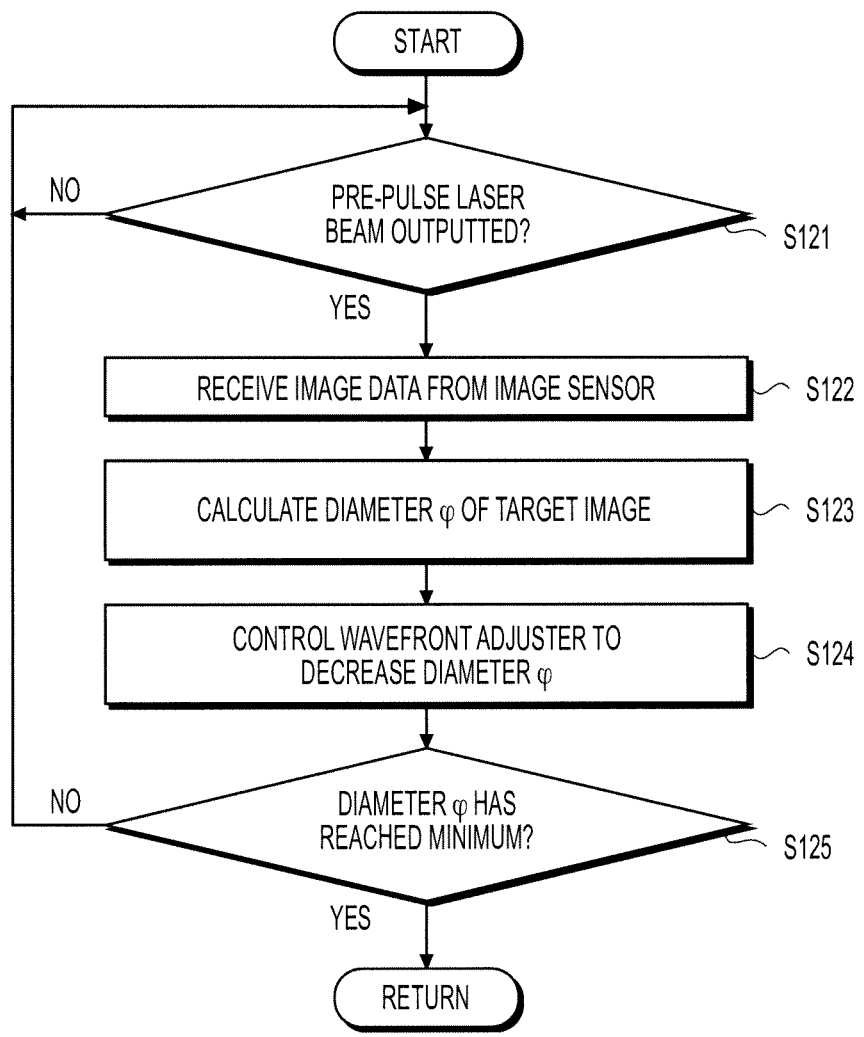
FIG. 7 is a flowchart showing an example of a wavefront adjusting subroutine in Step S107 of FIG. 6.

FIG. 7 is a flowchart showing an example of a wavefront adjusting subroutine in Step S107 of FIG. 6. With reference to FIG. 7, in the wavefront adjusting subroutine, the EUV light generation control device 51 may stand by until the pre-pulse laser beam 41 is outputted (Step S121; NO). When the pre-pulse laser beam 41 is outputted (Step S121; YES), the EUV light generation control device 51 may receive image date from the image sensor 372 (Step S122).

The EUV light generation control device 51 may calculate a diameter $\phi$ of the image of the target 27 from the received image data (Step S123) after receiving image date from the image sensor 372.

Subsequently, the EUV light generation control device 51 may control the wavefront adjuster 350 through the driver 353 so that the focus position of the pre-pulse laser beam 42 is brought to the position of a subsequent target 27 and thus a diameter $\phi$ of an image of the subsequent target 27 to be obtained in the image sensor 372 is smaller than the current instance of the diameter $\phi$ (Step S124). However, at an initial adjustment, it may not be clear whether the focus position of the pre-pulse laser beam 42 is offset in the +Z direction or in the −Z direction with respect to the position of the target 27. In that case, the wavefront adjuster 350 may be adjusted so that the focus position of the pre-pulse laser beam 42 is shifted to a preset direction at the initial adjustment. Based on the result obtained through the initial adjustment, the direction in which the focus position of the pre-pulse laser beam 42 approaches the specified position and a decrease in diameter $\phi$ may be identified for a subsequent adjustment. Then, the wavefront adjuster 350 may be adjusted accordingly so that the focus position of the pre-pulse laser beam 42 approaches the specified position. An amount of adjustment may be determined depending on the diameter $\phi$, or may be set in advance.

The EUV light generation controller 51 may then determine whether or not a diameter $\phi$ has reached the minimum (Step S125). Here, the determination as to whether a diameter $\phi$ has reached the minimum may be made based on whether a direction of a change in the diameter $\phi$ before and after an adjustment has shifted from a decrease to an increase. When a direction of a change in the diameter $\phi$ before and after an adjustment has shifted from a decrease to an increase, the previous instance of the control value for the wavefront adjuster 350 may be determined to the control value which brings the diameter $\phi$ to the minimum.

When the diameter $\phi$ has reached the minimum (Step S125; YES), the EUV light generation control device 51 may return to the operation shown in FIG. 6. When the diameter $\phi$ has not reached the minimum (Step S125; NO), the EUV light generation control device 51 may return to Step S121 and repeat the subsequent steps.

Through the above-described wavefront adjusting subroutine, the focus position of the pre-pulse laser beam 42 may be brought to substantially coincide with the position of the target 27 in the plasma generation region 25.

2.4.3 Wavefront Adjusting Subroutine

Modification

Figure 8:
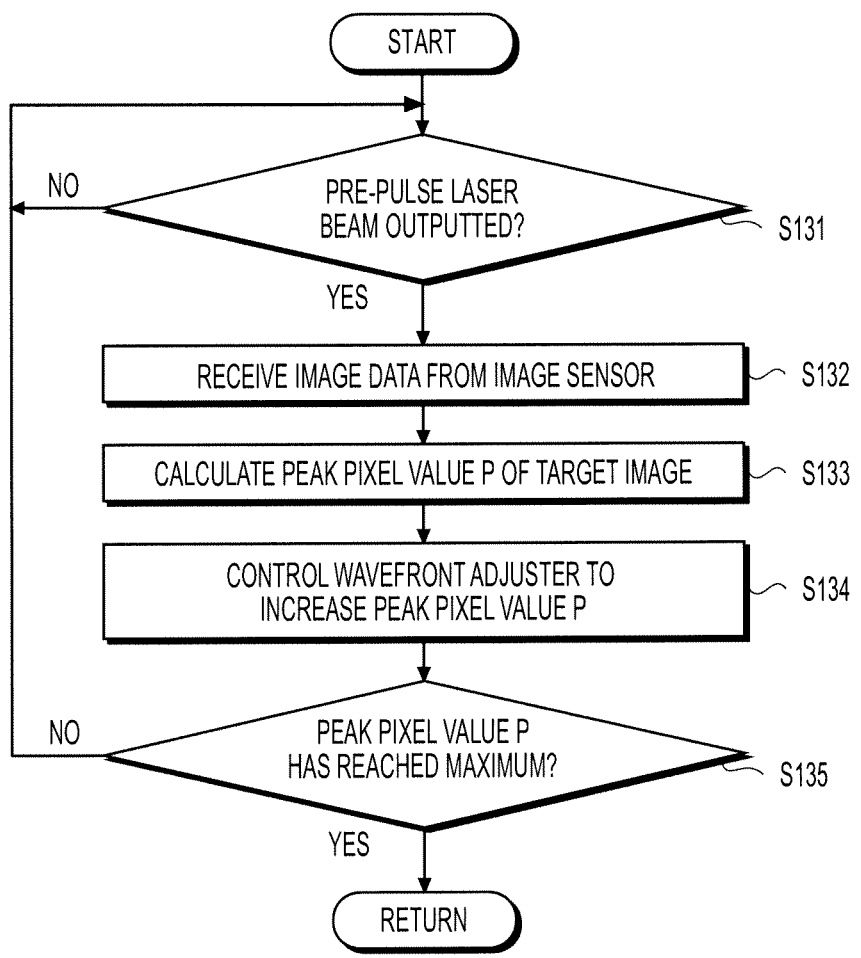
FIG. 8 is a flowchart showing a modification of the wavefront adjusting subroutine in Step S107 of FIG. 6.

The above-described wavefront adjusting subroutine may be modified as follows. FIG. 8 is a flowchart showing a modification of the wavefront adjusting subroutine in Step S107 of FIG. 6. With reference to FIG. 8, in the modification of the wavefront adjusting subroutine, the EUV light generation control device 51 may stand by until the pre-pulse laser beam 41 is outputted (Step S131; NO). When the pre-pulse laser beam 41 is outputted (Step S131; YES), the EUV light generation control device 51 may receive image data from the image sensor 372 (Step S132).

Then, the EUV light generation control device 51 may calculate a peak pixel value P from the received image data (Step S133).

Subsequently, the EUV light generation control device 51 may control the wavefront adjuster 350 through the driver 353 so that the focus position of the pre-pulse laser beam 42 approaches the position of a subsequent target 27. Thus, a peak pixel value P in a image of the subsequent target 27 obtained by the image sensor 372 is greater than the current instance of the peak pixel value P (Step S134). When the target 27 is not at the focal plane of the pre-pulse laser beam 42, an image obtained by the image sensor 372 may be blurred. A peak pixel value P in a blurred image may be smaller than that in an image in focus. Thus, controlling the wavefront adjuster 350 based on an observed peak pixel value P in an image obtained by the image sensor 372 allows the focus position of the pre-pulse laser beam 42 to be brought to the position of the target 27 in the plasma generation region 25. Here, as in the above-described wavefront adjusting subroutine, at an initial adjustment, it may not be clear whether the focus position of the pre-pulse laser beam 42 is offset in the +Z direction or in the −Z direction. In that case, the wavefront adjuster 350 may be adjusted so that the focus position of the pre-pulse laser beam 42 is shifted to a preset direction at the initial adjustment. Based on the result obtained through the initial adjustment, the direction in which the focus position of the pre-pulse laser beam 42 approaches the specified position and an increase in peak pixel value P may be identified for a subsequent adjustment. Then, the wavefront adjuster 350 may be adjusted accordingly so that the focus position of the pre-pulse laser beam 42 approaches the specified position. An amount of adjustment may be determined depending on the peak pixel value P, or may be set in advance.

Thereafter, the EUV light generation controller 51 may determine whether or not the peak pixel value P has reached the maximum (Step S135). Here, the determination as to whether the peak P has reached the maximum may be made based on whether a direction of a change in the peak pixel value P before and after an adjustment has shifted from an increase to a decrease. When a direction of a change in the peak pixel value P before and after an adjustment has shifted from an increase to a decrease, the previous instance of the control value for the wavefront adjuster 350 may be determined to be the control value which brings the peak pixel value P to the maximum.

When the peak pixel value P has reached the maximum (Step S135; YES), the EUV light generation control device 51 may return to the operation shown in FIG. 6. If the peak pixel value P has not reached the maximum (Step S135; NO), the EUV light generation control device 51 may return to Step S131 and repeat the subsequent steps.

Even through the above-described operation, the focus position of the pre-pulse laser beam 42 may be brought to substantially coincide with the position of the target 27 in the plasma generation region 25.

2.4.4 Delay Time Adjusting Subroutine

Figure 9:
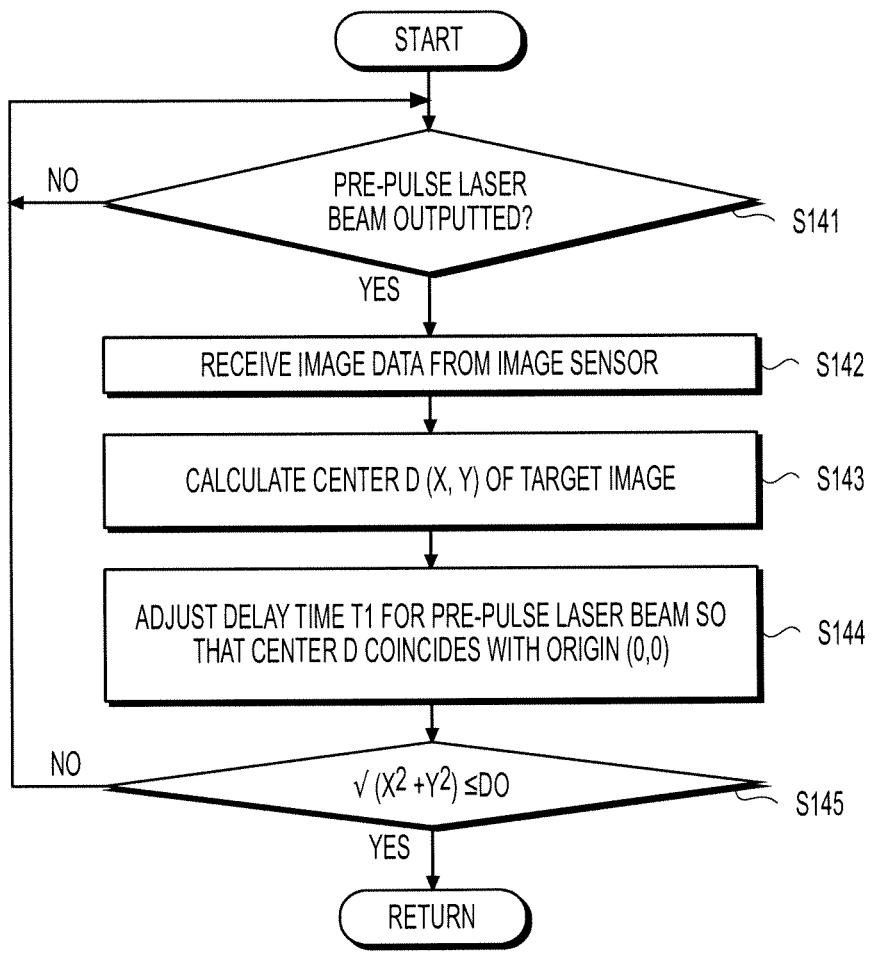
FIG. 9 is a flowchart showing an example of a delay time adjusting subroutine in Step S108 of FIG. 6.
Figure 10:
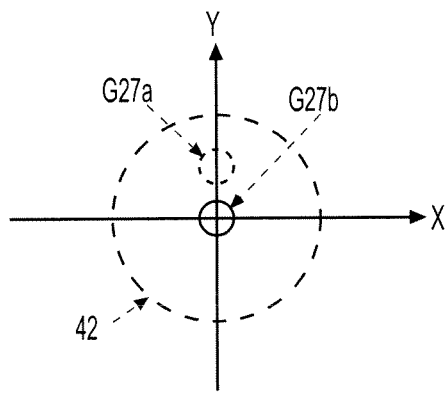
FIG. 10 schematically illustrates an example of an image in which images obtained before and after a delay time adjusting subroutine are superimposed on each other.

FIG. 9 is a flowchart showing an example of a delay time adjusting subroutine in Step S108 of FIG. 6. FIG. 10 schematically shows an example of an image in which images obtained before and after the delay time adjusting subroutine are superimposed on each other.

With reference to FIG. 9, in the delay time adjusting subroutine, the EUV light generation control device 51 may stand by until the pre-pulse laser beam 41 is outputted (Step S141; NO). When the pre-pulse laser beam 41 is outputted (Step S141; YES), the EUV light generation control device 51 may receive image data from the image sensor 372 (Step S142).

Then, the EUV light generation control device 51 may calculate the center D (x,y) in the image of the target 27 from the received image data (Step S143) after receiving image data from the image sensor 372 in Step S142.

Subsequently, the EUV light generation control device 51 may adjust the delay time T1 for the irradiation with the pre-pulse laser beam 41 which is set in the delay circuit 55 so that the center D in an image of a subsequent target 27 coincides with a predetermined position at the time of irradiation (Step S144). The stated predetermined position may correspond to the origin (0,0) in an image formed on the photosensitive surface of the image sensor 372 by the imaging lens 371. An amount of adjustment may be calculated from a distance between the origin (0,0) and the center D.

Thereafter, the EUV light generation control device 51 may determine whether or not a distance $\sqrt{(x^2+y^2)}$ between the origin (0,0) and the center D (x,y) is equal to or less than a permissible distance D0 (Step S145). The permissible distance D0 may be set in advance or may be given from an external apparatus such as the exposure apparatus controller 61.

When the distance $\sqrt{(x^2+y^2)}$ is equal to or less than the permissible distance D0 (Step S145; YES), the EUV light generation control device 51 may return to the operation shown in FIG. 6. When the distance $\sqrt{(x^2+y^2)}$ is greater than the permissible distance D0 (Step S145; NO), the EUV light generation control device 51 may return to Step S141 and repeat the subsequent steps.

Through the above-described delay time adjusting subroutine, a deviation in the position of a target 27 along the Y-axis in the focal plane of the pre-pulse laser beam 42 may be reduced. For example, as shown in FIG. 10, a state where an image G27a of the target 27 in the obtained image data is offset along the Y-axis may be brought to a state indicated by an image G27b whose center substantially coincides with the origin or the center of the obtained image data.

2.4.5 Wavefront Stabilization Subroutine

Figure 11:
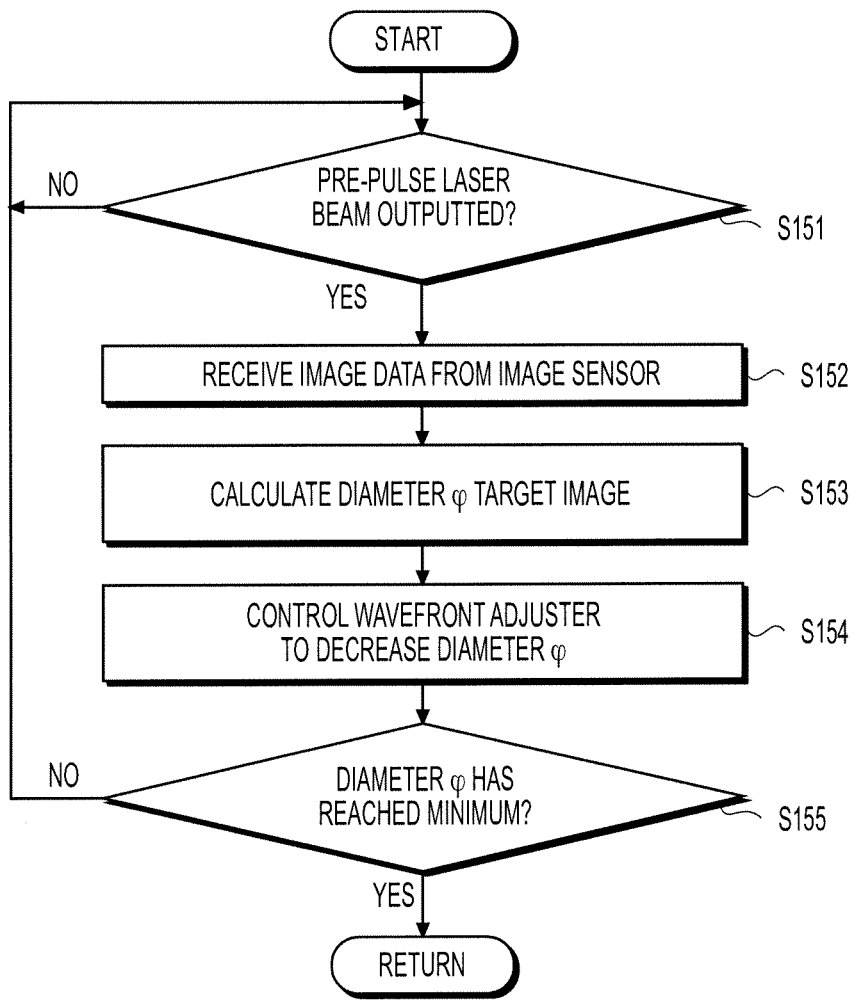
FIG. 11 is a flowchart showing an example of a wavefront stabilization subroutine in Step S115 of FIG. 6.

FIG. 11 is a flowchart showing an example of a wavefront stabilization subroutine in Step S115 of FIG. 6. With reference to FIG. 11, in the wavefront stabilization subroutine, the EUV light generation control device 51 may stand by until the pre-pulse laser beam 41 is outputted (Step S151; NO). When the pre-pulse laser beam 41 is outputted (Step S151; YES), the EUV light generation control device 51 may receive image data from the image sensor 372 (Step S152).

Then, the EUV light generation control device 51 may calculate a diameter $\phi$ in the image of the target 27 from the received image data (Step S153) after receiving receive image data from the image sensor 372 in Step S152.

Subsequently, the EUV light generation control device 51 may control the wavefront adjuster 350 through the driver 353 so that the focus position of the pre-pulse laser beam 42 approaches the position of a subsequent target 27 in the specified position. Thus, the diameter $\phi$ in the image of the subsequent target 27 is smaller than the current instance of the diameter $\phi$ (Step S154). However, as in the above-described wavefront adjusting subroutine, at an initial adjustment, it may not be clear whether the focus position of the pre-pulse laser beam 42 is offset in the +Z direction or in the −Z direction. In that case, the wavefront adjuster 350 may be adjusted so that the focus position of the pre-pulse laser beam 42 is shifted to a preset direction at the initial adjustment. Based on the result obtained through the initial adjustment, the direction in which the focus position of the pre-pulse laser beam 42 approaches the specified position, and a decrease in diameter $\phi$ may be identified for a subsequent adjustment. Then, the wavefront adjuster 350 may be adjusted accordingly so that the focus position of the pre-pulse laser beam 42 approaches the specified position. An amount of adjustment may be determined depending on the diameter $\phi$, or may be set in advance.

Thereafter, the EUV light generation controller 51 may determine whether or not the diameter $\phi$ has reached the minimum (Step S155). Here, the determination as to whether the diameter $\phi$ has reached the minimum may be made based on whether a direction of a change in the diameter $\phi$ before and after an adjustment has shifted from a decrease to an increase. When a direction of a change in the diameter $\phi$ before and after an adjustment has shifted from a decrease to an increase, the previous instance of the control value for the wavefront adjuster 350 may be determined to be the control value which brings the diameter $\phi$ to the minimum.

When the diameter $\phi$ has reached the minimum (Step S155; YES), the EUV light generation control device 51 may return to the operation shown in FIG. 6. When the diameter $\phi$ has not reached the minimum (Step S155; NO), the EUV light generation control device 51 may return to Step S151 and repeat the subsequent steps.

Through the above-described wavefront stabilization subroutine, the focus of the pre-pulse laser beam 42 may be stabilized with respect to the position of the target 27 in the plasma generation region 25 while the EUV light 252 is generated.

2.4.6 Wavefront Stabilization Subroutine Modification

Figure 12:
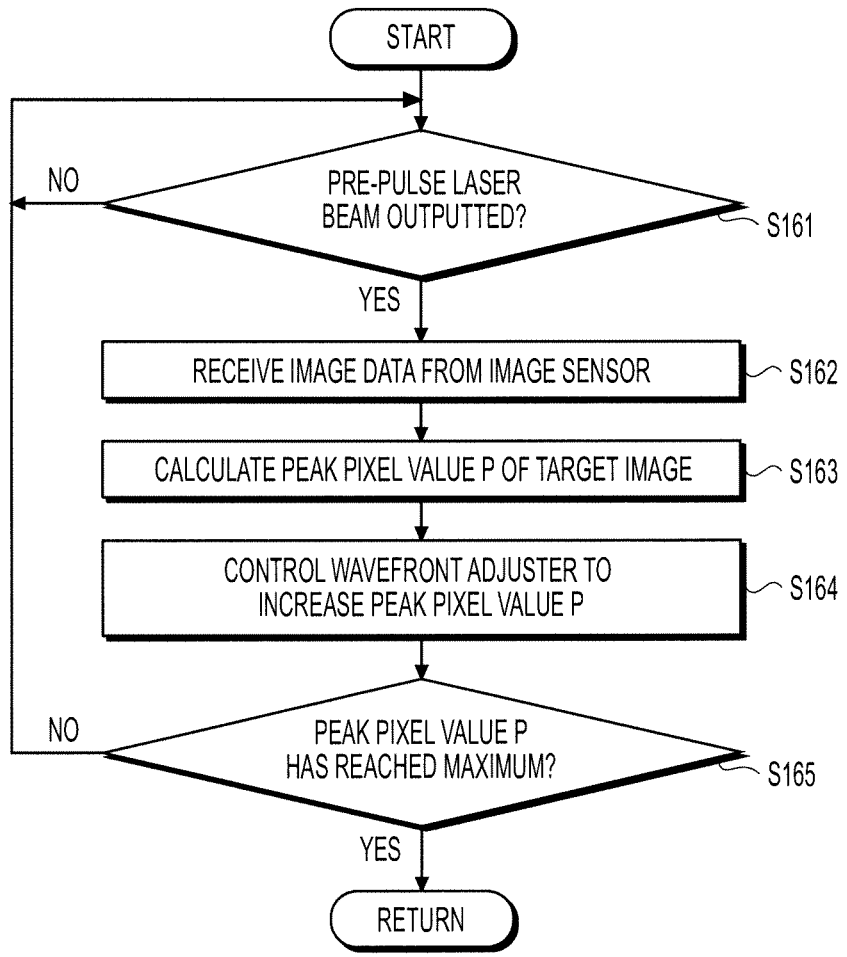
FIG. 12 is a flowchart showing a modification of the wavefront stabilization subroutine in Step S115 of FIG. 6.

The above-described wavefront stabilization subroutine may be modified as follows. FIG. 12 is a flowchart showing a modification of the wavefront stabilization subroutine in Step S115 of FIG. 6. With reference to FIG. 12, in the modification of the wavefront stabilization subroutine, the EUV light generation control device 51 may stand by until the pre-pulse laser beam 41 is outputted (Step S161; NO). When the pre-pulse laser beam 41 is outputted (Step S161; YES), the EUV light generation control device 51 may receive image data from the image sensor 372 (Step S162).

Then, the EUV light generation control device 51 may calculate a peak pixel value P from the received image data (Step S163).

Subsequently, the EUV light generation control device 51 may control the wavefront adjuster 350 through the driver 353 so that the focus position of the pre-pulse laser beam 42 approaches the position of a subsequent target 27 in the specified position. Thus, the peak pixel value P in an image of the subsequent target 27 is greater than the current instance of the peak pixel value P (Step S164). Here, as in the above-described wavefront stabilization subroutine, at an initial adjustment, it may not be clear whether the focus position of the pre-pulse laser beam 42 is offset in the +Z direction or in the −Z direction. In that case, the wavefront adjuster 350 may be adjusted so that the focus position of the pre-pulse laser beam 42 is shifted to a preset direction at the initial adjustment. Based on the result obtained through the initial adjustment, the direction in which the focus position of the pre-pulse laser beam 42 approaches the specified position and an increase in peak pixel value P may be identified for a subsequent adjustment. Then, the wavefront adjuster 350 may be adjusted accordingly so that the focus position of the pre-pulse laser beam 42 approaches the specified position. An amount of adjustment may be determined depending on the peak pixel value P, or may be set in advance.

Thereafter, the EUV light generation control device 51 may determine whether or not the peak pixel value P has reached the maximum (Step S165). Here, the determination as to whether the peak pixel value P has reached the maximum may be made based on whether a direction of a change in the peak pixel value P before and after an adjustment has shifted from an increase to a decrease. When a direction of a change in the peak pixel value P before and after an adjustment has shifted from an increase to a decrease, the previous instance of the control value for the wavefront adjuster 350 may be determined to be the control value which brings the peak pixel value P to the maximum.

When the peak pixel value P has reached the maximum (Step S165; YES), the EUV light generation control device 51 may return to the operation shown in FIG. 6. When the peak pixel value P has not reached the maximum (Step S165; NO), the EUV light generation control device 51 may return to Step S161 and repeat the subsequent steps.

Even through the above-described operation, the focus position of the pre-pulse laser beam 42 may be stabilized with respect to the position of the target 27 in the plasma generation region 25 while the EUV light 252 is generated.

3. EUV Light Generation System Including Optical Detector for Detecting Reflected Rays of Guide Laser Beam

Second Embodiment

3.1 Configuration

Figure 13:
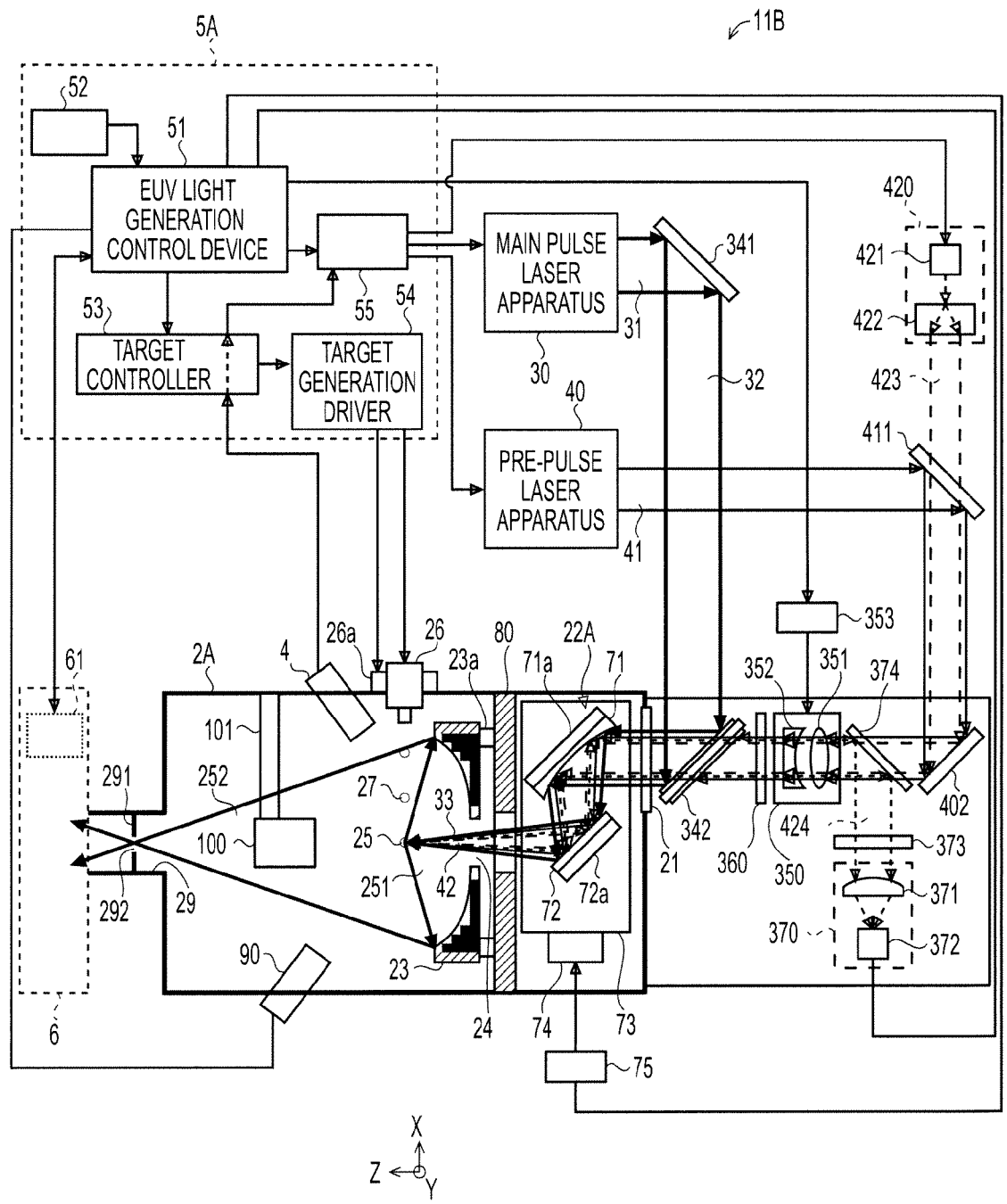
FIG. 13 schematically illustrates an exemplary configuration of an EUV light generation system according to a second embodiment of the present disclosure.

FIG. 13 schematically illustrates an exemplary configuration of an EUV light generation system 11B according to a second embodiment of the present disclosure. The EUV light generation system 11B shown in FIG. 13 may be similar in configuration to the EUV light generation system 11A shown in FIG. 2. However, the EUV light generation system 11B may include a dichroic mirror 411 in place of the high-reflection mirror 401. Further, the EUV light generation system 11B may include a guide laser apparatus 420.

The pre-pulse laser beam 41 outputted from the pre-pulse laser apparatus 40 may be reflected by dichroic mirror 411 and be incident on the high-reflection mirror 402.

The guide laser apparatus 420 may include a guide laser device 421 and a beam expander 422. A trigger signal may be inputted to the guide laser device 421 from the EUV light generation control device 51 through the delay circuit 55. The guide laser device 421 may output a guide laser beam 423 in accordance with a trigger signal.

The beam expander 422 may be configured to expand the cross-section of the guide laser beam 423 outputted from the guide laser device 421 to approximately the same size as the cross-section of the pre-pulse laser beam 41 incident on the dichroic mirror 411.

The guide laser beam 423 from the guide laser apparatus 420 may be transmitted through the dichroic mirror 411. The dichroic mirror 411 may be positioned to bring the beam axis of the pre-pulse laser beam 41 reflected thereby and the beam axis of the guide laser beam 423 transmitted therethrough to substantially coincide with each other.

The guide laser beam 423 transmitted through the dichroic mirror 411 may be reflected by the high-reflection mirror 402, and travel through the polarization beam splitter 374, the wavefront adjuster 350, the quarter-wave plate 360, the dichroic mirror 342, and the window 21 to enter the laser beam focusing optical system 22A. Then, the guide laser beam 423 may be focused on a target 27 passing through the plasma generation region 25 inside the chamber 2A. In the second embodiment, the wavefront adjuster 350 may have been compensated for chromatic aberration for both the pre-pulse laser beam 41 and the guide laser beam 423.

A part of the guide laser beam 423 that has struck the target 27 may be reflected as a backpropagating beam 424. The backpropagating beam 424 may travel through the laser beam focusing optical system 22A, the dichroic mirror 342, the quarter-wave plate 360, and the wavefront adjuster 350, and be reflected by the polarization beam splitter 374 to enter the optical detector 370. The optical detector 370 may detect an image of the backpropagating beam 424 of the guide laser beam 423, similar to the image of the backpropagating beam 43 of the pre-pulse laser beam 42. Then, the optical detector 370 may send the detected image data to the EUV light generation control device 51.

3.2 Operation

An operation of the EUV light generation system 11B shown in FIG. 13 will now be described. The EUV light generation system 11B may operate under the control of the EUV light generation controller 5A.

The guide laser beam 423 outputted from the guide laser apparatus 420 may be a linearly-polarized pulse laser beam. The pulse energy of the guide laser beam 423 may be at a level that is not sufficient to break a target 27.

The guide laser beam 423 reflected by the high-reflection mirror 402 may be incident on the polarization beam splitter 374 primarily as a P-polarization component. Thus, the guide laser beam 423 may be transmitted through the polarization beam splitter 374 and may enter the wavefront adjuster 350. The wavefront adjuster 350 may adjust the wavefront of the guide laser beam 423, if necessary, under the control of the EUV light generation control device 51. The guide laser beam 423 from the wavefront adjuster 350 may then be transmitted through the quarter-wave plate 360 to thereby be converted into a circularly polarized laser beam.

The guide laser beam 423 may be transmitted through the dichroic mirror 342, and may enter the chamber 2A through the window 21 after being converted into a circularly polarized laser beam.

The guide laser beam 423 that has entered the chamber 2A may be reflected sequentially by the off-axis paraboloidal mirror 71 and the high-reflection mirror 72, and focused on a target 27 in the plasma generation region 25.

A part of the guide laser beam 423 focused on the target 27 may be reflected by the surface of the target 27 as the backpropagating beam 424. The backpropagating beam 424 may be circularly polarized.

The backpropagating beam 424 may be reflected sequentially by the high-reflection mirror 72 and the off-axis paraboloidal mirror 71, and transmitted through the dichroic mirror 342. Thereafter, the backpropagating beam 424 may be transmitted through the quarter-wave plate 360 to thereby be converted into a linearly-polarized laser beam. The polarization state of the backpropagating beam 424 at this point may be such that the backpropagating beam 424 will be incident on the polarization beam splitter 374 primarily as an S-polarization component. Then, the backpropagating beam 424 may travel through the wavefront adjuster 350, and may be reflected by the polarization beam splitter 374. Thereafter, the backpropagating beam 424 may be transmitted through the wavelength filter 373 with high transmittance.

The backpropagating beam 424 transmitted through the wavelength filter 373 may be focused by the imaging lens 371, and imaged on the photosensitive surface of the image sensor 372. Thus, an image of the target 27 illuminated by the guide laser beam 423 may be formed on the photosensitive surface of the image sensor 372. The image sensor 372 may then output the obtained image to the EUV light generation control device 51 as image data.

The EUV light generation control device 51 may analyze the inputted image data. The EUV light generation control device 51 may then send a control signal to the driver 353 of the wavefront adjuster 350 based on an analysis result. More specifically, the EUV light generation control device 51 may send a control signal to the driver 353 so that the focus position of the guide laser beam 423 coincides with the position of a subsequent target 27 in the plasma generation region 25. Thus, an image data of the subsequent target 27 obtained by the image sensor 372 is in focus. The driver 353 may output a drive signal to the wavefront adjuster 350 in accordance with a received control signal.

A delay time T3 may be set in the delay circuit 55 so that the guide laser beam 423 is outputted from the guide laser apparatus 420 at the same timing as the pre-pulse laser beam 41 is outputted from the pre-pulse laser apparatus 40. The delay time T3 may be set relative to a passing timing signal, as in the delay time T1. A trigger signal may be inputted to the guide laser apparatus 420 to control the guide laser apparatus 420 to oscillate at a timing delayed by a time equivalent to the delay time T3 with respect to a passing timing signal. However, the guide laser apparatus 420 may be configured to output the guide laser beam 423 even while the pre-pulse laser beam 41 is not outputted.

Here, when an optical path length between the guide laser apparatus 420 and the plasma generation region 25 is substantially equal to an optical path length between the pre-pulse laser apparatus 40 and the plasma generation region 25, the delay time T3 may be substantially equal to the delay time T1.

3.3 Effect

In the second embodiment, the backpropagating beam 424 of the guide laser beam 423 may be detected, in place of the backpropagating beam 43 of the pre-pulse laser beam 41. Thus, the focus of the laser beam focusing optical system 22A may be brought to the position of the target 27 without generating the EUV light 252, or without outputting the pre-pulse laser beam 41. Accordingly, a target 27 does not need to be diffused only to adjust the laser beam focusing optical system 22A, and debris may be prevented from being generated.

The wavelength of the guide laser beam 423 may be the same as or different from the wavelength of the pre-pulse laser beam 41. For example, a He—Ne laser at a wavelength of 633 nm may be adopted to generate the guide laser beam 423, and a YAG laser at a wavelength of 1.06 μm may be adopted to generate the pre-pulse laser beam 42. In this case, achromatic lenses may be used in the wavelength adjuster 350. Meanwhile, when the wavelength of the guide laser beam 423 and the wavelength of the pre-pulse laser beam 41 are the same, that is, when YAG lasers or yttrium lithium fluoride (YLF) lasers are used for both, the wavefront adjuster 350 does not need to include an achromatic lens.

3.4 Flowcharts

3.4.1 EUV Light Generation Flow

Figure 14:
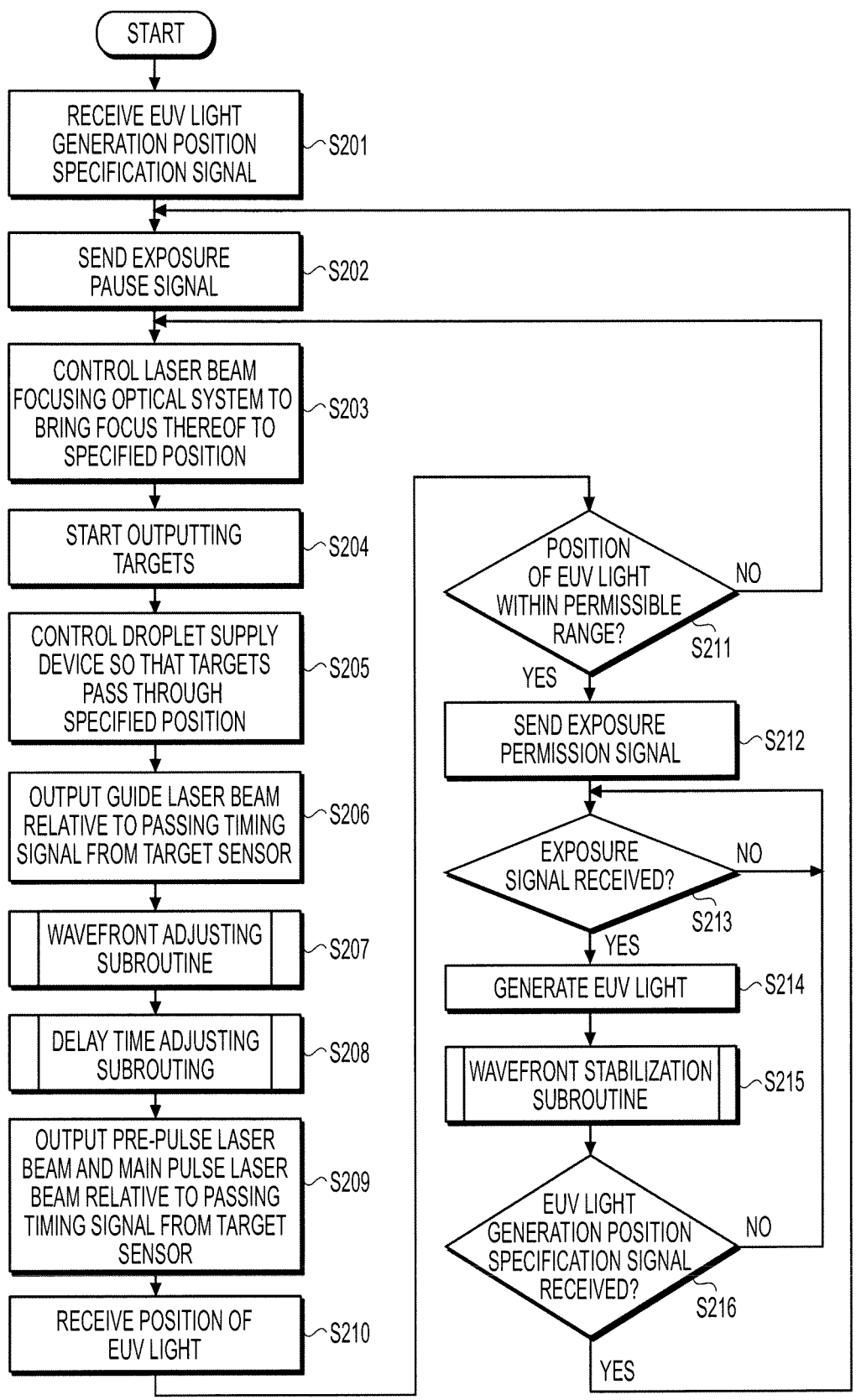
FIG. 14 is a flowchart showing an example of an overall operation of an EUV light generation controller according to the second embodiment.

FIG. 14 is a flowchart showing an example of an overall operation of an EUV light generation control device according to the second embodiment. With reference to FIG. 14, the EUV light generation control device 51 may first receive an EUV light generation position specification signal specifying a position at which the EUV light 252 is to be generated (Step S201). An EUV light generation position specification signal may be inputted to the EUV light generation control device 51 from an external apparatus such as the exposure apparatus controller 61. Alternatively, in place of an EUV light generation position specification signal, various signals instructing or requesting for exposure may be used. These signals may contain information to specify a position at which the EUV light 252 is to be generated.

Upon receiving an EUV light generation position specification signal, the EUV light generation control device 51 may send an exposure pause signal to the exposure apparatus controller 61 (Step S202). Then, the EUV light generation control device 51 may control the laser beam focusing optical system 22A through the driver 75 so that the focus of the laser beam focusing optical system 22A coincides with the position specified by the received EUV light generation position specification signal (Step S203).

Then, the EUV light generation control device 51 may control the target supply device 26 to start outputting targets 27 through the target controller 53 (Step S204). After Step S204, the target supply device 26 may continue to output the targets 27 at a predetermined repetition rate until a pause signal is received.

Subsequently, the EUV light generation control device 51 may control the two-axis moving mechanism 26a to adjust the position of the target supply device 26 so that targets 27 pass through the specified position (Step S205). The adjustment of the position of the target supply device 26 may be carried out based on information including a trajectory of a target 27 detected by the target sensor 4.

Thereafter, the EUV light generation control device 51 may control the guide laser apparatus 420 to output the guide laser beam 423 at a timing relative to a passing timing signal of a target 27 received from the target sensor 4 (Step S206). In Step S206, a trigger signal may be outputted from the EUV light generation control device 51 with an input of a passing timing signal serving as a reference. A trigger signal may be inputted to the guide laser apparatus 420 through the delay circuit 55 in which the delay time T3 for the guide laser beam 423 is set. Here, the target sensor 4 may detect the targets 27 outputted at a predetermined repetition rate. Thus, the guide laser apparatus 420 may output the guide laser beam 423 at the predetermined repetition rate.

Then, the EUV light generation control device 51 may carry out a wavefront adjusting subroutine to adjust a wavefront of the guide laser beam 423 (Step S207). Thereafter, the EUV light generation control device 51 may carry out a delay time adjusting subroutine to adjust an irradiation timing of a target 27 with the guide laser beam 423 (Step S208). In the delay time adjusting subroutine, the delay times T1 through T3 set in the delay circuit 55 may be updated.

Subsequently, the EUV light generation control device 51 may instruct the pre-pulse laser apparatus 40 and the main pulse laser apparatus 30 to output the pre-pulse laser beam 41 and the main pulse laser beam 31, respectively, at respective timings relative to a passing timing signal of a target 27 received from the target sensor 4 (Step S209). In Step S209, trigger signals may be outputted from the EUV light generation control device 51 with an input of a passing timing signal serving as a reference. Trigger signals may be inputted to the pre-pulse laser apparatus 40 and the main pulse laser apparatus 30, respectively, through the delay circuit 55 in which the delay time T1 for the pre-pulse laser beam 41 and the delay time T2 for the main pulse laser beam 31 are set.

Then, the EUV light generation control device 51 may receive information on a position at which the EUV light 252 has been generated detected by the EUV monitor 90 (Step S210). Thereafter, the EUV light generation control device 51 may determine whether or not the received position of the EUV light 252 falls within a permissible range (Step S211). Here, the EUV light generation control device 51 may stop trigger signals to be outputted to the pre-pulse laser apparatus 40 and the main pulse laser apparatus 30 regardless of a determination result. Further, the EUV light generation control device 51 may stop an output of the target 27 through the target controller 53. The aforementioned permissible range may be set in advance or may be given from an external apparatus such as the exposure apparatus controller 61.

When the received position of the EUV light 252 does not fall within the permissible range (Step S211; NO), the EUV light generation control device 51 may return to Step S203 and repeat the subsequent steps. When the received position of the EUV light 252 falls within the permissible range (Step S211; YES), the EUV light generation control device 51 may send an exposure permission signal to the exposure apparatus controller 61 (Step S212). In response to the exposure permission signal, the exposure apparatus controller 61 may return an exposure signal indicating the start of exposure to the EUV light generation control device 51.

Subsequently, the EUV light generation control device 51 may stand by until it receives an exposure signal from the exposure apparatus controller 61 (Step S213; NO). Upon receiving an exposure signal (Step S213; YES), the EUV light generation control device 51 may output trigger signals to the pre-pulse laser apparatus 40 and the main pulse laser apparatus 30, respectively. Further, the EUV light generation control device 51 may control the target supply device 26 to start outputting targets 27 through the target controller 53. Thus, the EUV light generation control device 51 may carry out an operation to generate EUV light 252 (Step S214). Then, the EUV light generation control device 51 may carry out a wavefront stabilization subroutine to stabilize the wavefront of the pre-pulse laser beam 41 (Step S215).

Thereafter, the EUV light generation control device 51 may determine whether or not it has received an EUV light generation position specification signal from the exposure apparatus controller 61 to reinstruct or modify a position at which the EUV light 252 is to be generated (Step S216). When an EUV light generation position specification signal has not been received (Step S216; NO), the EUV light generation control device 51 may return to Step S213 and repeat the subsequent steps. When an EUV light generation position specification signal has been received (Step S216; YES), the EUV light generation control device 51 may return to Step S202 and repeat the subsequent steps.

Through the above-described operation, the EUV light 252 may be generated while the focus position of the pre-pulse laser beam 41 is stabilized. Thus, the EUV light 252 may be generated at a stable position and with stable intensity. Here, the operation shown in FIG. 14 may be terminated sequentially by interrupt processing through a signal indicating termination of exposure.

3.4.2 Wavefront Adjusting Subroutine

Figure 15:
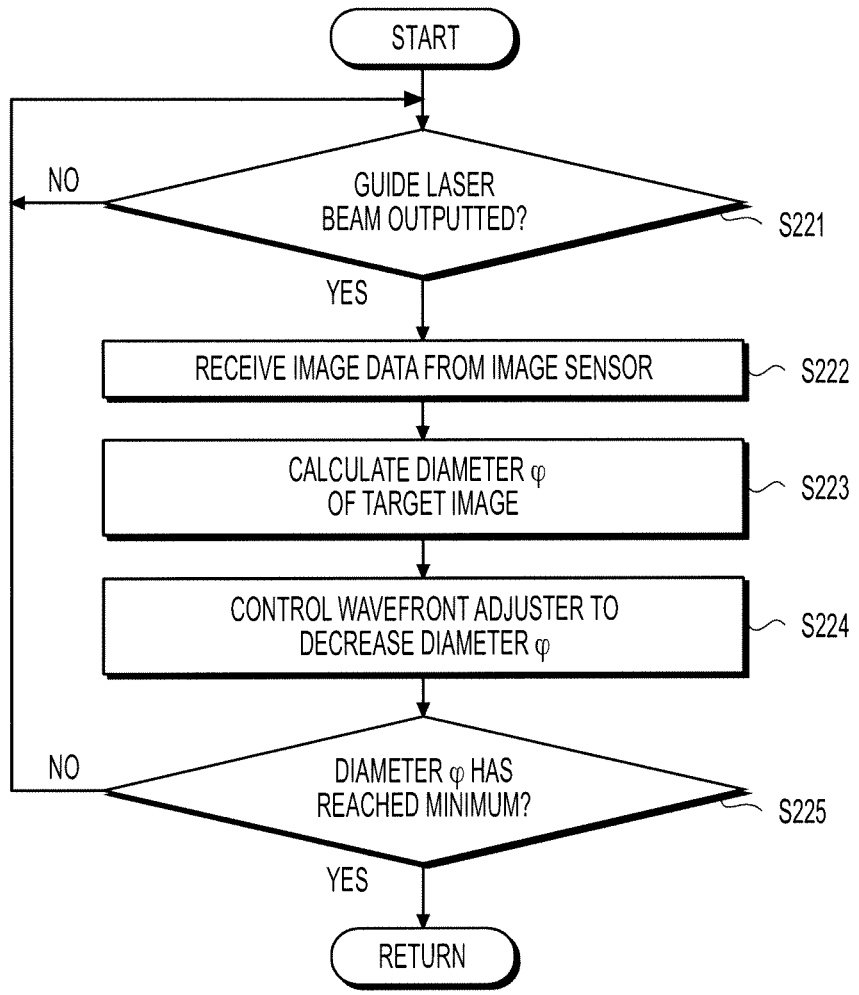
FIG. 15 is a flowchart showing an example of a wavefront adjusting subroutine in Step S207 of FIG. 14.

FIG. 15 is a flowchart showing an example of a wavefront adjusting subroutine in Step S207 of FIG. 14. With reference to FIG. 15, in the wavefront adjusting subroutine, the EUV light generation control device 51 may stand by until the guide laser beam 423 is outputted (Step S221; NO). When the guide laser beam 423 is outputted (Step S221; YES), the EUV light generation control device 51 may receive image data from the image sensor 372 (Step S222).

The EUV light generation control device 51 may calculate a diameter $\phi$ in an image of the target 27 from the received image data (Step S223) after receive image data from the image sensor 372 in Step S222.

Subsequently, the EUV light generation control device 51 may control the wavefront adjuster 350 through the driver 353 so that the focus position of the guide laser beam 423 approaches the position of a subsequent target 27 in the specified position. Thus, a diameter $\phi$ of an image of the subsequent target 27 is smaller than the current instance of the diameter $\phi$ (Step S224). However, at an initial adjustment, it may not be clear whether the focus of the guide laser beam 423 is offset in the +Z direction or in the −Z direction. In that case, the wavefront adjuster 350 may be adjusted so that the focus position of the guide laser beam 423 is shifted to a preset direction at the initial adjustment. Based on the result obtained through the initial adjustment, the direction in which the focus position of the guide laser beam 423 approaches the specified position and a decrease in diameter $\phi$ may be identified for a subsequent adjustment. Then, the wavefront adjuster 350 may be adjusted accordingly so that the focus position of the guide laser beam 423 approaches the specified position. An amount of adjustment may be determined depending on the diameter $\phi$, or may be set in advance.

Thereafter, the EUV light generation control device 51 may determine whether or not the diameter $\phi$ has reached the minimum (Step S225). Here, the determination as to whether the diameter $\phi$ has reached the minimum may be made based on whether a direction of a change in the diameter $\phi$ before and after an adjustment has shifted from a decrease to an increase. When a direction of a change in the diameter $\phi$ before and after an adjustment has shifted from a decrease to an increase, the previous instance of the control value for the wavefront adjuster 350 may be determined to be the control value which brings the diameter $\phi$ to the minimum.

When the diameter $\phi$ has reached the minimum (Step S225; YES), the EUV light generation control device 51 may return to the operation shown in FIG. 14. If the diameter $\phi$ has not reached the minimum (Step S225; NO), the EUV light generation control device 51 may return to Step S221 and repeat the subsequent steps.

Through the above-described wavefront adjusting subroutine, the focus of the pre-pulse laser beam 42 may be brought to substantially coincide with the position of the target 27 in the plasma generation region 25.

3.4.3 Wavefront Adjusting Subroutine

Modification

Figure 16:
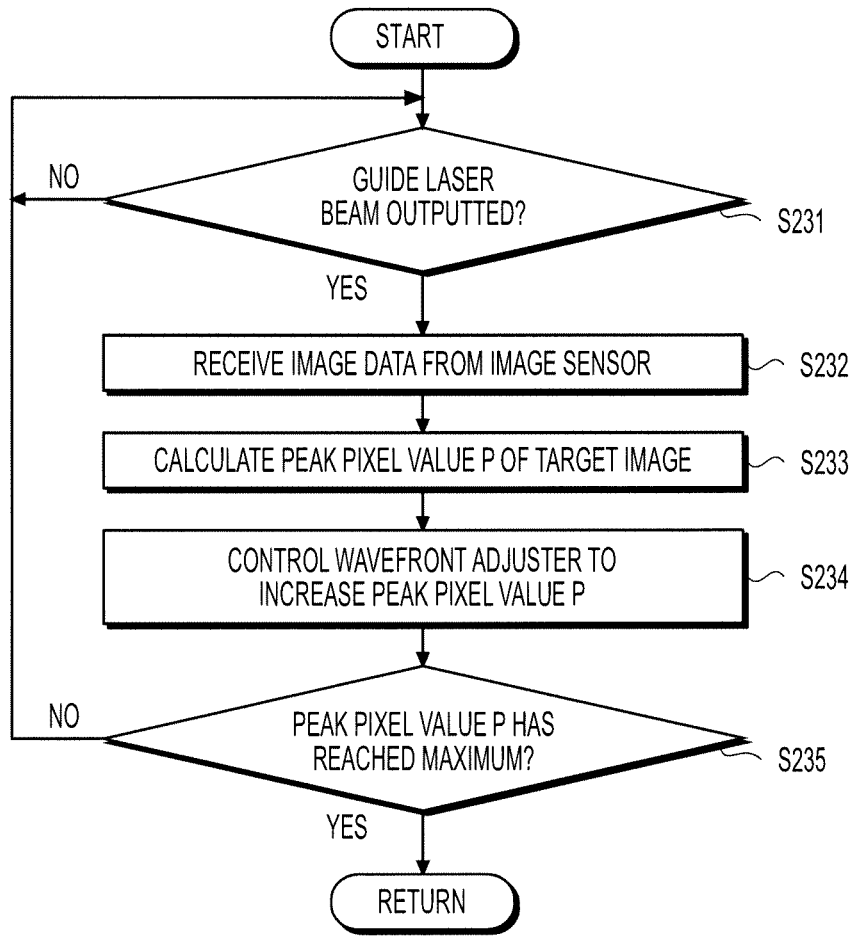
FIG. 16 is a flowchart showing a modification of the wavefront adjusting subroutine in Step S207 of FIG. 14.

The above-described wavefront adjusting subroutine may be modified as follows. FIG. 16 is a flowchart showing a modification of the wavefront adjusting subroutine in Step S207 of FIG. 14. With reference to FIG. 16, in the modification of the wavefront adjusting subroutine, the EUV light generation control device 51 may stand by until the guide laser beam 423 is outputted (Step S231; NO). When the guide laser beam 423 is outputted (Step S231; YES), the EUV light generation control device 51 may receive image data from the image sensor 372 (Step S232).

Then, the EUV light generation control device 51 may calculate a peak pixel value P from the received image data (Step S233).

Subsequently, the EUV light generation control device 51 may control the wavefront adjuster 350 through the driver 353 so that the focus position of the guide laser beam 423 approaches the position of a subsequent target 27 in the specified position. Thus, the peak pixel value P in an image of the subsequent target 27 is greater than the current instance of the peak pixel value P (Step S234). However, at an initial adjustment, it may not be clear whether the focus of the guide laser beam 423 is offset in the +Z direction or in the −Z direction. In that case, the wavefront adjuster 350 may be adjusted so that the focus position of the guide laser beam 423 is shifted to a preset direction at the initial adjustment. Based on the result obtained through the initial adjustment, the direction in which the focus position of the guide laser beam 423 approaches the specified position and an increase in peak pixel value P may be identified for a subsequent adjustment. Then, the wavefront adjuster 350 may be adjusted accordingly so that the focus position of the guide laser beam 423 approaches the specified position. An amount of adjustment may be determined depending on the peak pixel value P, or may be set in advance.

Thereafter, the EUV light generation control device 51 may determine whether or not the peak pixel value P has reached the maximum (Step S235). Here, the determination as to whether the peak pixel value P has reached the maximum may be made based on whether a direction of a change in the peak pixel value P before and after an adjustment has shifted from an increase to a decrease. When a direction of a change in the peak pixel value P before and after an adjustment has shifted from an increase to a decrease, the previous instance of the control value for the wavefront adjuster 350 may be determined to be the control value which brings the peak pixel value P to the maximum.

When the peak pixel value P has reached the maximum (Step S235; YES), the EUV light generation control device 51 may return to the operation shown in FIG. 14. If the peak pixel value P has not reached the maximum (Step S235; NO), the EUV light generation control device 51 may return to Step S231 and repeat the subsequent steps.

Through the above-described operation as well, the focus of the pre-pulse laser beam 42 may be brought to substantially coincide with the position of the target 27 in the plasma generation region 25.

3.4.4 Delay Time Adjusting Subroutine

Figure 17:
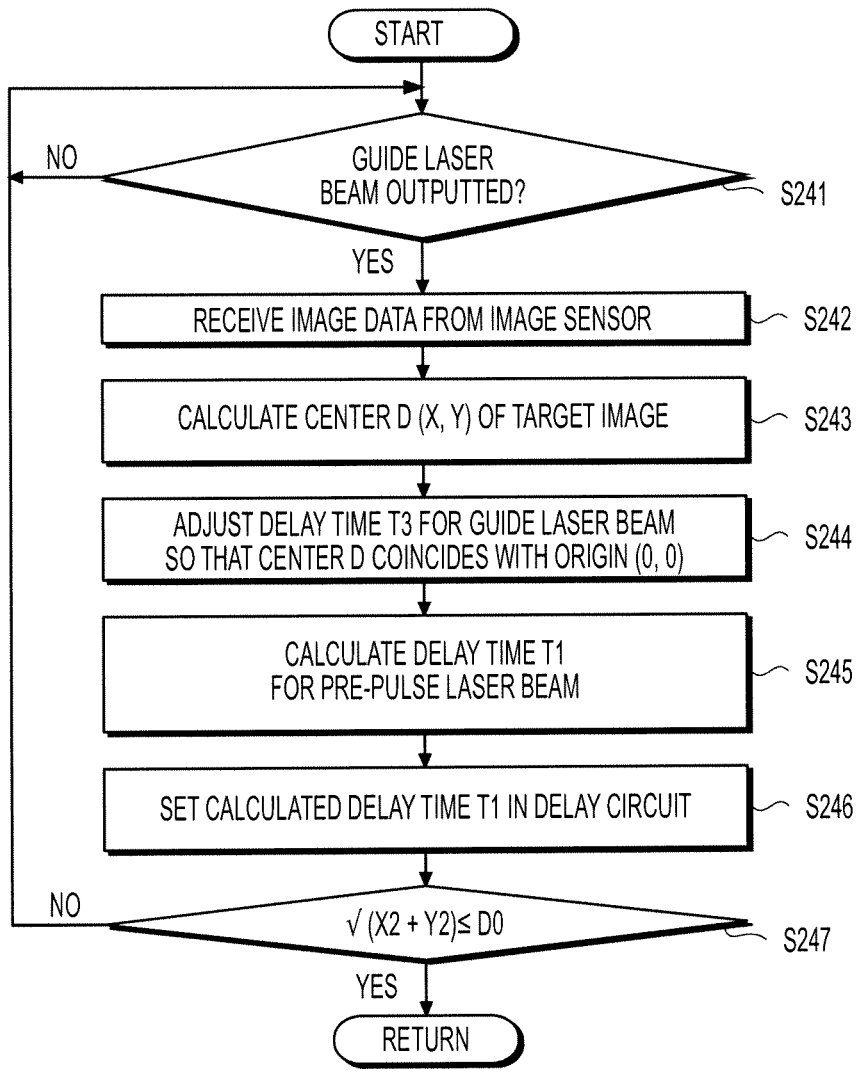
FIG. 17 is a flowchart showing an example of a delay time adjusting subroutine in Step S208 of FIG. 14.
Figure 18:
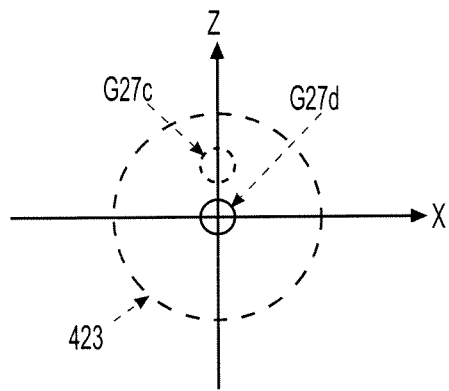
FIG. 18 schematically illustrates an example of an image in which images obtained before and after a delay time adjusting subroutine are superimposed on each other.

FIG. 17 is a flowchart showing an example of a delay time adjusting subroutine in Step S208 of FIG. 14. FIG. 18 schematically shows an example of an image in which images obtained before and after the delay time adjusting subroutine are superimposed on each other.

With reference to FIG. 17, in the delay time adjusting subroutine, the EUV light generation control device 51 may stand by until the guide laser beam 423 is outputted (Step S241; NO). When the guide laser beam 423 is outputted (Step S241; YES), the EUV light generation control device 51 may receive image data from the image sensor 372 (Step S242).

Then, the EUV light generation control device 51 may calculate the center D (x,y) of the image of the target 27 from the received image data (Step S243).

Subsequently, the EUV light generation control device 51 may adjust the delay time T3 for the guide laser beam 423 set in the delay circuit 55 so that the center D of a subsequent target 27 coincides with a predetermined position in the plasma generation region 25 (Step S244). The stated predetermined position may correspond to the origin (0,0) of an image formed on the photosensitive surface of the image sensor 372 by the imaging lens 371. An amount of adjustment may be calculated from a distance between the origin (0,0) and the center D.

Then, the EUV light generation control device 51 may calculate the delay time T1 for the pre-pulse laser beam 41 using the adjusted delay time T3 (Step S245). Here, when a difference between the optical path length of the guide laser beam 423 and the optical path length of the pre-pulse laser beam 41 is $\Delta L$, the adjusted delay time T1 may be obtained by adding to the adjusted delay time T3 a value obtained by dividing the optical path length difference $\Delta L$ by the speed of light c. Further, the EUV light generation control device 51 may set the calculated delay time T1 in the delay circuit 55 (Step S246).

Thereafter, the EUV light generation control device 51 may determine whether or not a distance $\sqrt{(x^2+y^2)}$ between the origin (0,0) and the center D (x,y) is equal to or less than a permissible distance D0 (Step S247). The permissible distance D0 may be set in advance or may be given from an external apparatus such as the exposure apparatus controller 61.

When the distance $\sqrt{(x^2+y^2)}$ is equal to or less than the permissible distance D0 (Step S247; YES), the EUV light generation control device 51 may return to the operation shown in FIG. 14. When the distance $\sqrt{(x^2+y^2)}$ is greater than the permissible distance D0 (Step S247; NO), the EUV light generation control device 51 may return to Step S241 and repeat the subsequent steps.

Through the above-described delay time adjusting subroutine, the focus of the guide laser beam 423 may be obtained to reduce a deviation in the focus of the pre-pulse laser beam 42 along the Y-axis with respect to the position of the target 27 in the plasma generation region 25. For example, as shown in FIG. 18, a state where an image G27c of a target 27 in the image data is offset along the Y-axis may be brought to a state where the center of an image G27d of a target 27 substantially coincides with the origin (0,0).

3.4.5 Wavefront Stabilization Subroutine

Figure 19:
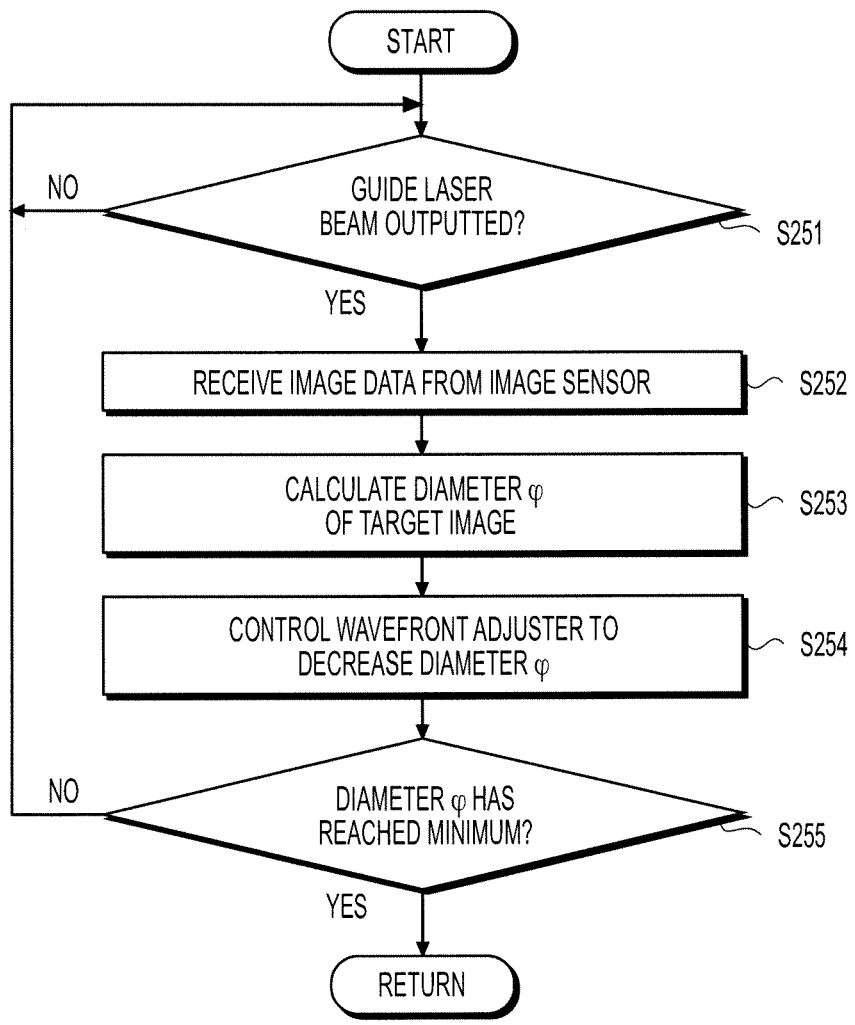
FIG. 19 is a flowchart showing an example of a wavefront stabilization subroutine in Step S214 of FIG. 14.

FIG. 19 is a flowchart showing an example of a wavefront stabilization subroutine in Step S215 of FIG. 14. With reference to FIG. 19, in the wavefront stabilization subroutine, the EUV light generation control device 51 may stand by until the guide laser beam 423 is outputted (Step S251; NO). When the guide laser beam 423 is outputted (Step S251; YES), the EUV light generation control device 51 may receive image data from the image sensor 372 (Step S252).

The EUV light generation control device 51 may calculate a diameter $\phi$ of the image of the target 27 from the received image data (Step S253) after receiving image data from the image sensor 372 in Step S252.

Subsequently, the EUV light generation control device 51 may control the wavefront adjuster 350 through the driver 353 so that the focus position of the guide laser beam approaches the position of a subsequent target 27 in the specified position and thus a diameter $\phi$ of an image of the subsequent target 27 is smaller than the current instance of the diameter $\phi$ (Step S254). However, at an initial adjustment, it may not be clear whether the focus position of the guide laser beam 423 is offset in the +Z direction or in the −Z direction. In that case, the wavefront adjuster 350 may be adjusted so that the focus position of the guide laser beam 423 is shifted to a preset direction at the initial adjustment. Based on the result obtained through the initial adjustment, the direction in which the focus position of the guide laser beam 423 approaches the specified position and a decrease in diameter $\phi$ may be identified for a subsequent adjustment. Then, the wavefront adjuster 350 may be adjusted accordingly so that the focus position of the guide laser beam 423 approaches the specified position. An amount of adjustment may be determined depending on the diameter $\phi$, or may be set in advance.

Thereafter, the EUV light generation control device 51 may determine whether or not the diameter $\phi$ has reached the minimum (Step S255). Here, the determination as to whether the diameter $\phi$ has reached the minimum may be made based on whether a direction of a change in the diameter $\phi$ before and after an adjustment has shifted from a decrease to an increase. When a direction of a change in the diameter $\phi$ before and after an adjustment has shifted from a decrease to an increase, the previous instance of the control value for the wavefront adjuster 350 may be determined to be the control value which brings the diameter $\phi$ to the minimum.

When the diameter $\phi$ has reached the minimum (Step S255; YES), the EUV light generation control device 51 may return to the operation shown in FIG. 14. If the diameter $\phi$ has not reached the minimum (Step S255; NO), the EUV light generation control device 51 may return to Step S251 and repeat the subsequent steps.

Through the above-described wavefront stabilization subroutine, the focus of the pre-pulse laser beam 42 may be stabilized with respect to the position of the target 27 in the plasma generation region 25 while the EUV light 252 is generated. Here, while the EUV light 252 is generated, the backpropagating beam 43 of the pre-pulse laser beam 42 may be used in place of the backpropagating beam 424 of the guide laser beam 423.

3.4.6 Wavefront Stabilization Subroutine

Modification

Figure 20:
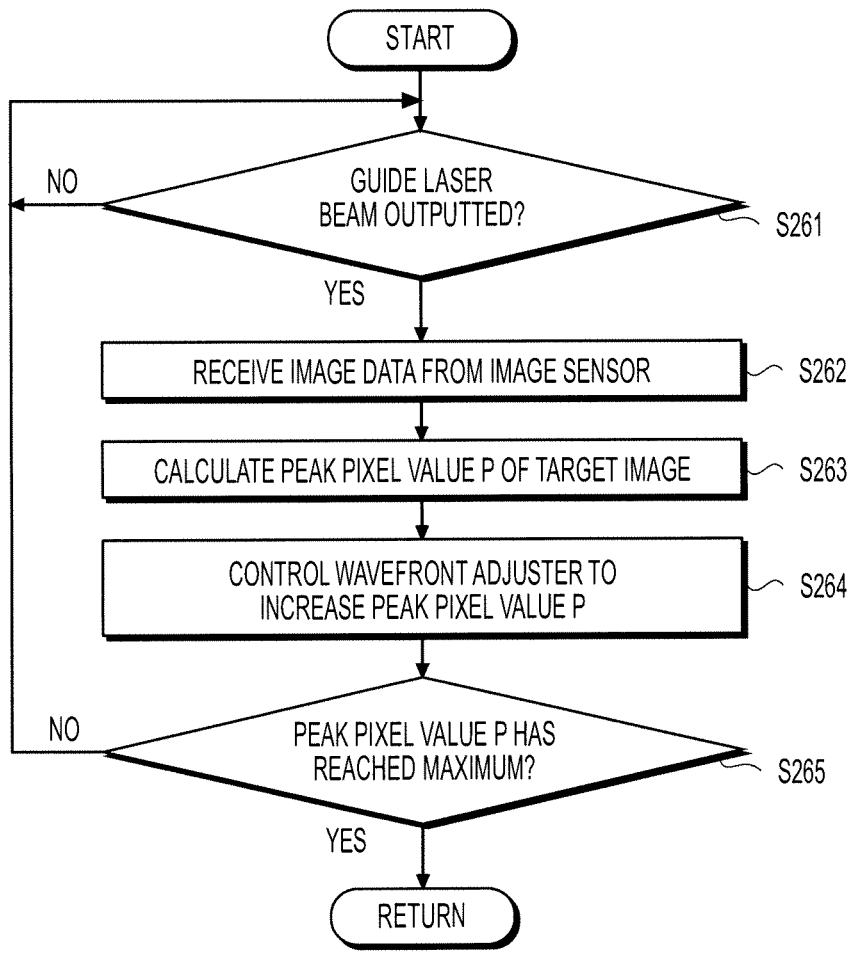
FIG. 20 is a flowchart showing a modification of the wavefront stabilization subroutine in Step S214 of FIG. 14.

The above-described wavefront stabilization subroutine may be modified as follows. FIG. 20 is a flowchart showing a modification of the wavefront stabilization subroutine in Step S215 of FIG. 14. With reference to FIG. 20, in the modification of the wavefront stabilization subroutine, the EUV light generation control device 51 may stand by until the guide laser beam 423 is outputted (Step S261; NO). When the guide laser beam 423 is outputted (Step S261; YES), the EUV light generation control device 51 may receive image data from the image sensor 372 (Step S262).

The EUV light generation control device 51 may calculate a peak pixel value P from the received image data (Step S263) after receiving image data from the image sensor 372 in Step S262.

Subsequently, the EUV light generation control device 51 may control the wavefront adjuster 350 through the driver 353 so that the focus position of the guide laser beam 423 approaches the position of a subsequent target 27 in the specified position. Thus, a peak pixel value P in an image of the subsequent target 27 is greater than the current instance of the peak pixel value P (Step S264). However, at an initial adjustment, it may not be clear whether the focus of the guide laser beam 423 is offset in the +Z direction or in the −Z direction. In that case, the wavefront adjuster 350 may be adjusted so that the focus position of the guide laser beam 423 is shifted to a preset direction at the initial adjustment. Based on the result obtained through the initial adjustment, the direction in which the focus position of the guide laser beam 423 approaches the specified position and an increase in peak pixel value P may be identified for a subsequent adjustment. Then, the wavefront adjuster 350 may be adjusted accordingly so that the focus position of the guide laser beam 423 approaches the specified position. An amount of adjustment may be determined depending on the peak pixel value P, or may be set in advance.

Thereafter, the EUV light generation control device 51 may determine whether or not the peak pixel value P has reached the maximum (Step S265). Here, the determination as to whether the peak pixel value P has reached the maximum may be made based on whether a direction of a change in the peak pixel value P before and after an adjustment has shifted from an increase to a decrease. When a direction of a change in the peak pixel value P before and after an adjustment has shifted from an increase to a decrease, the previous instance of the control value for the wavefront adjuster 350 may be determined to be the control value which brings the peak pixel value P to the maximum.

When the peak pixel value P has reached the maximum (Step S265; YES), the EUV light generation control device 51 may return to the operation shown in FIG. 14. If the peak pixel value P has not reached the maximum (Step S265; NO), the EUV light generation control device 51 may return to Step S261 and repeat the subsequent steps.

Through the above-described operation as well, the focus of the pre-pulse laser beam 42 may be stabilized with respect to the position of the target 27 in the plasma generation region 25 while the EUV light 252 is generated.

4. EUV Light Generation System where Laser Beam Focusing Optical System Includes Lens

Third Embodiment

4.1 Configuration

Figure 21:
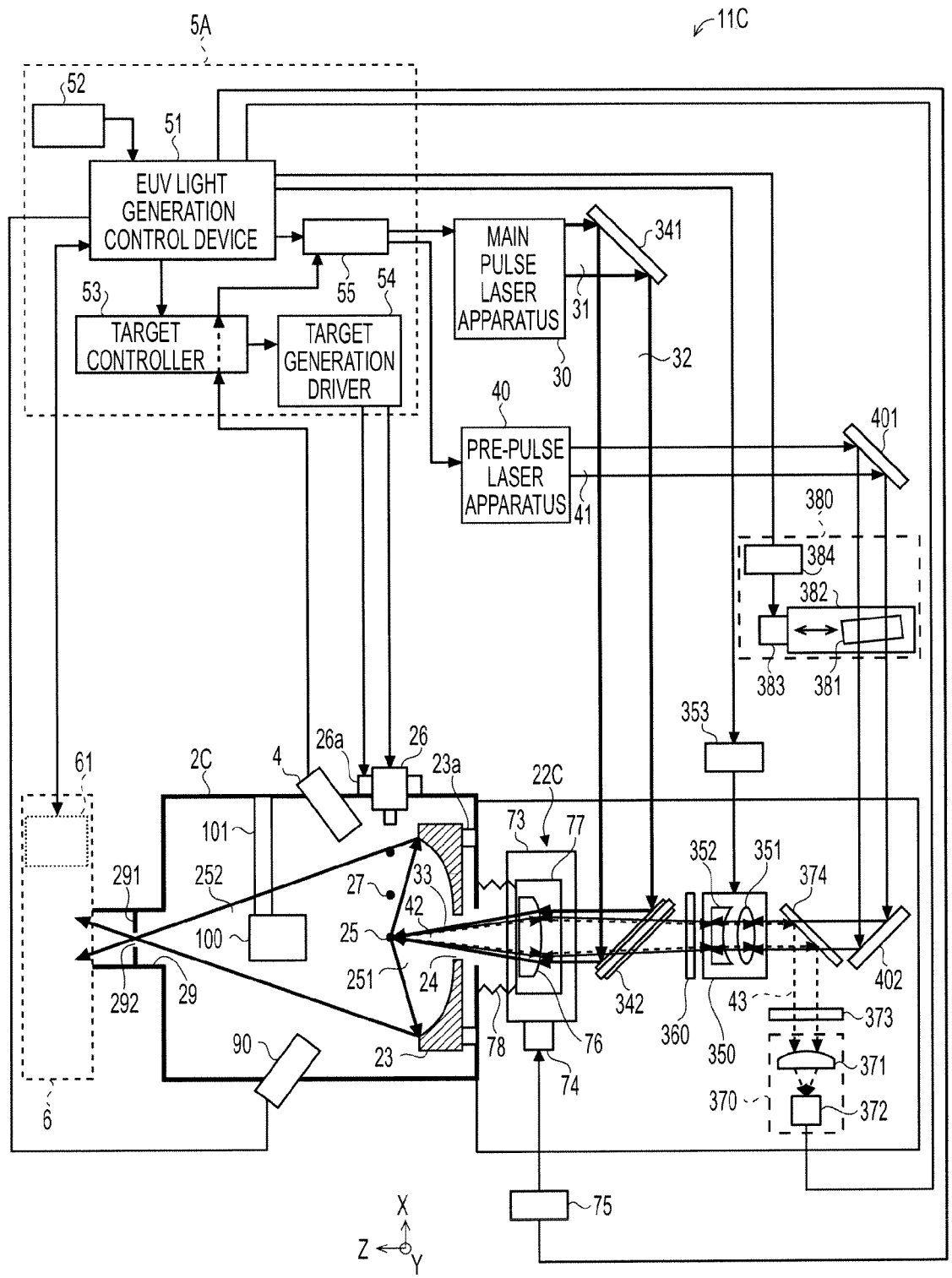
FIG. 21 schematically illustrates an exemplary configuration of an EUV light generation system according to a third embodiment of the present disclosure.

FIG. 21 schematically illustrates an exemplary configuration of an EUV light generation system according to a third embodiment of the present disclosure. An EUV light generation system 11C shown in FIG. 21 may be similar in configuration to the EUV light generation system 11A shown in FIG. 2. However, the EUV light generation system 11C may include a laser beam focusing optical system 22C in place of the laser beam focusing optical system 22A, and a chamber 2C in place of the chamber 2A. Further, the EUV light generation system 11C may include an attenuation unit 380. The chamber 2C may be similar in configuration to the chamber 2A. However, the partition 80 may be omitted in the chamber 2C.

The laser beam focusing optical system 22C may include a convex lens 76, a lens holder 77, the moving plate 73, and the plate moving mechanism 74. A vacuum bellows 78 may be provided between the convex lens 76 and the chamber 2C to provide an airtight seal therebetween.

The attenuation unit 380 may include an attenuator 381, a moving plate 382, a plate moving mechanism 383, and a driver 384. The attenuator 381 may be fixed to the slidable moving plate 382. The plate moving mechanism 383 may insert or remove the attenuator 381 together with the moving plate 382 into or from the beam path of the pre-pulse laser beam 41.

4.2 Operation

An operation of the EUV light generation system 11C shown in FIG. 21 will now be described. The EUV light generation system 11C may operate under the control of the EUV light generation controller 5A.

Generally, a focal distance of a lens having a focus depends partially on a wavelength. However, even when the convex lens 76 is used in the laser beam focusing optical system 22C, the focus of the pre-pulse laser beam 42 and the focus of the main pulse laser beam 33 at distinct wavelengths may be controlled to substantially coincide with each other using the wavefront adjuster 350.

In the third embodiment, similarly to the above-described embodiments, an image of a target 27 may be detected using the backpropagating beam 43 of the pre-pulse laser beam 42, and the wavefront adjuster 350 may be controlled based on a detection result.

Further, the attenuation unit 380 may operate under the control of the EUV light generation control device 51. The EUV light generation control device 51 may drive the plate moving mechanism 383 through the driver 384 to dispose the attenuator 381 in a beam path of the pre-pulse laser beam 41 when the EUV light 252 is not to be generated. Thus, the pulse energy of the pre-pulse laser beam 41 that has passed through the attenuator 381 may be reduced to a level at which a target 27 is not diffused. Accordingly, even if a target 27 is irradiated with the pre-pulse laser beam 42 while the EUV light 252 is not to be generated, generation of debris may be suppressed.

4.3 Effect

According to the third embodiment, even when a lens that is difficult to be compensated for chromatic aberration, such as a lens formed solely of diamond, is used in the laser beam focusing optical system 22C to focus the main pulse laser beam 32 and the pre-pulse laser beam 41, respectively, the focus position of the pre-pulse laser beam 42 and the focus position of the main pulse laser beam 33 may be controlled to desired positions, respectively.

Further, it is possible to detect an image of a target 27 using the pre-pulse laser beam 42 that has been attenuated by the attenuator 381 while the EUV light 252 is not to be generated. Thus, the focus position of the pre-pulse laser beam 42 by the laser beam focusing optical system 22C may be controlled to the position of the target 27 in the plasma generation region 25 without generating the EUV light 252. Accordingly, the pre-pulse laser beam 42 may be focused on the target 27 with high precision from the beginning of generating the EUV light 252.

4.4 Flowchart

An exemplary operation of the EUV light generation system 11C according to the third embodiment will now be described in detail with reference to the drawings.

4.4.1 EUV Light Generation Flow

Figure 22:
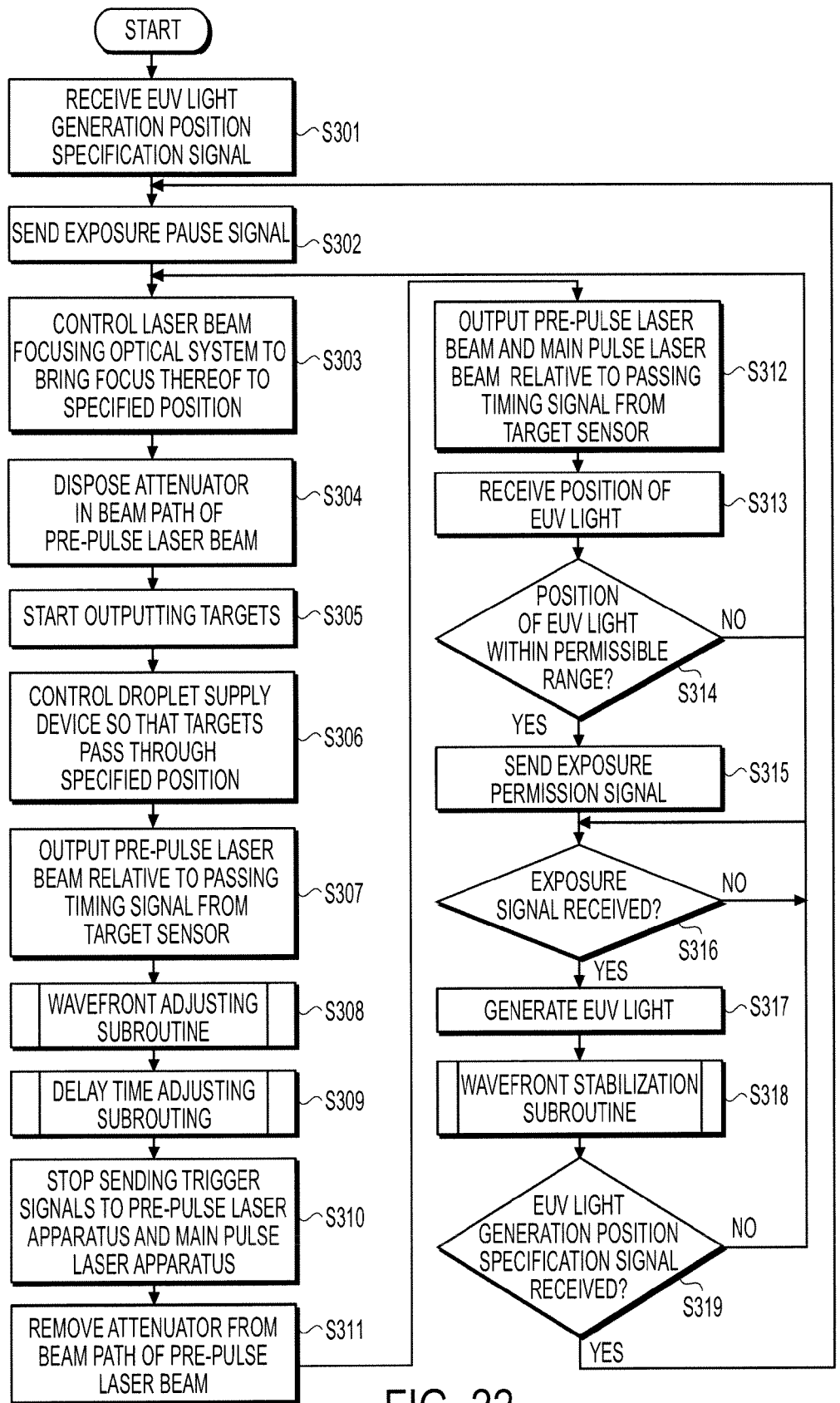
FIG. 22 is a flowchart showing an example of an overall operation of an EUV light generation controller according to the third embodiment.

FIG. 22 is a flowchart showing an example of an overall operation of an EUV light generation control device according to the third embodiment. With reference to FIG. 22, the EUV light generation control device 51 may first receive an EUV light generation position specification signal specifying a position at which the EUV light 252 is to be generated (Step S301). An EUV light generation position specification signal may be inputted to the EUV light generation control device 51 from an external apparatus such as the exposure apparatus controller 61. Alternatively, in place of an EUV light generation position specification signal, various signals instructing or requesting for exposure may be used. These signals may contain information to specify a position at which the EUV light 252 is to be generated.

Upon receiving an EUV light generation position specification signal, the EUV light generation control device 51 may send an exposure pause signal to the exposure apparatus controller 61 (Step S302). Then, the EUV light generation control device 51 may adjust the laser beam focusing optical system 22C through the driver 75 so that the focus of the laser beam focusing optical system 22C coincides with the position specified in the received EUV light generation position specification signal (Step S303).

Then, the EUV light generation control device 51 may drive the plate moving mechanism 383 through the driver 384 to dispose the attenuator 381 in a beam path of the pre-pulse laser beam 41 (Step S304). Thus, the pulse energy of the pre-pulse laser beam 41 that has passed through the attenuator 381 may be reduced to a level at which a target 27 is not diffused.

Subsequently, the EUV light generation control device 51 may control the target supply device 26 to start outputting targets 27 through the target controller 53 (Step S304). Here, after Step S305, the target supply device 26 may continue to output targets 27 at a predetermined repetition rate until a pause signal is received.

Thereafter, the EUV light generation control device 51 may instruct the two-axis moving mechanism 26a to adjust the position of the target supply device 26 so that targets 27 pass through the specified position (Step S306). The adjustment of the position of the target supply device 26 may be carried out based on information including a trajectory of a target 27 detected by the target sensor 4.

Then, the EUV light generation control device 51 may instruct the pre-pulse laser apparatus 40 to output the pre-pulse laser beam 41 at a timing relative to a passing timing signal of q target 27 received from the target sensor 4 (Step S307). In Step S307, a trigger signal may be outputted from the EUV light generation control device 51 with an input of a passing timing signal serving as a reference. The trigger signal may be inputted to the pre-pulse laser apparatus 40 through the delay circuit 55 in which the delay time T1 for the pre-pulse laser beam 41 is set. Here, the target sensor 4 may detect the targets 27 outputted at a predetermined repetition rate. Thus, the pre-pulse laser apparatus 40 may output the pre-pulse laser beam 41 at the predetermined repetition rate.

Subsequently, the EUV light generation control device 51 may carry out a wavefront adjusting subroutine to adjust a wavefront of the pre-pulse laser beam 41 (Step S308). Then, the EUV light generation control device 51 may carry out a delay time adjusting subroutine to adjust an irradiation timing of the target 27 with the pre-pulse laser beam 41 (Step S309). In the delay time adjusting subroutine, the delay times T1 and T2 set in the delay circuit 55 may be updated.

Thereafter, the EUV light generation control device 51 may stop outputting trigger signals to the pre-pulse laser apparatus 40 and the main pulse laser apparatus 30, respectively (Step S310). Thus, the pre-pulse laser beam 41 and the main pulse laser beam 31 may stop being outputted respectively from the pre-pulse laser apparatus 40 and the main pulse laser apparatus 30.

Then, the EUV light generation control device 51 may drive the plate moving mechanism 383 through the driver 384 to remove the attenuator 381 from a beam path of the pre-pulse laser beam 41 (Step S311).

Subsequently, the EUV light generation control device 51 may instruct the pre-pulse laser apparatus 40 and the main pulse laser apparatus 30 to output the pre-pulse laser beam 41 and the main pulse laser beam 31, respectively, at timings relative to a passing timing signal of a target 27 received from the target sensor 4 (Step S312). In Step S312, trigger signals may be outputted from the EUV light generation control device 51 with an input of a passing timing signal serving as a reference. Trigger signals may be inputted respectively to the pre-pulse laser apparatus 40 and the main pulse laser apparatus 30 through the delay circuit 55 in which the delay time T1 for the pre-pulse laser beam 41 and the delay time T2 for the main pulse laser beam 31 are set.

Thereafter, the EUV light generation control device 51 may receive information on a position of the EUV light 252 detected by the EUV monitor 90 (Step S313). Then, the EUV light generation control device 51 may determine whether or not the received position of the EUV light 252 falls within a permissible range (Step S314). At this point, the EUV light generation control device 51 may stop outputting trigger signals to the pre-pulse laser apparatus 40 and the main pulse laser apparatus 30 regardless of the determination result. Further, the EUV light generation control device 51 may cause the targets 27 to stop being outputted through the target controller 53. The aforementioned permissible range may be set in advance or may be given from an external apparatus such as the exposure apparatus controller 61.

When the received position of the EUV light 252 does not fall within the permissible range (Step S314; NO), the EUV light generation control device 51 may return to Step S303 and repeat the subsequent steps. When the received position of the EUV light 252 falls within the permissible range (Step S314; YES), the EUV light generation control device 51 may send an exposure permission signal to the exposure apparatus controller 61 (Step S315). In response to the exposure permission signal, the exposure apparatus controller 61 may return an exposure signal indicating the start of exposure to the EUV light generation control device 51.

Then, the EUV light generation control device 51 may stand by until it receives an exposure signal from the exposure apparatus controller 61 (Step S316; NO). Upon receiving an exposure signal (Step S316; YES), the EUV light generation control device 51 may output trigger signals to the pre-pulse laser apparatus 40 and the main pulse laser apparatus 30, respectively. Further, the EUV light generation control device 51 may instruct the target supply device 26 to start outputting targets 27 through the target controller 53. Thus, the EUV light generation control device 51 may carry out an operation to generate the EUV light 252 (Step S317). Subsequently, the EUV light generation control device 51 may carry out a wavefront stabilization subroutine to stabilize the wavefront of the pre-pulse laser beam 41 (Step S318).

Thereafter, the EUV light generation control device 51 may determine whether or not it has received an EUV light generation position specification signal from the exposure apparatus controller 61 to reinstruct or modify a position at which the EUV light 252 is to be generated (Step S319). If an EUV light generation position specification signal has not been received (Step S319; NO), the EUV light generation control device 51 may return to Step S316 and repeat the subsequent steps. When an EUV light generation position specification signal has been received (Step S319; YES), the EUV light generation control device 51 may return to Step S302 and repeat the subsequent steps.

Through the above-described operation, the EUV light 252 may be generated while the focus position of the pre-pulse laser beam 41 is stabilized. Thus, the EUV light 252 may be generated at a stable position and with stable intensity. Here, the operation shown in FIG. 22 may be terminated sequentially by interrupt processing through a signal indicating termination of exposure.

5. Examples of Wavefront Adjuster

5.1 Combination of Spherical Convex Lens and Spherical Concave Lens

Figure 23:
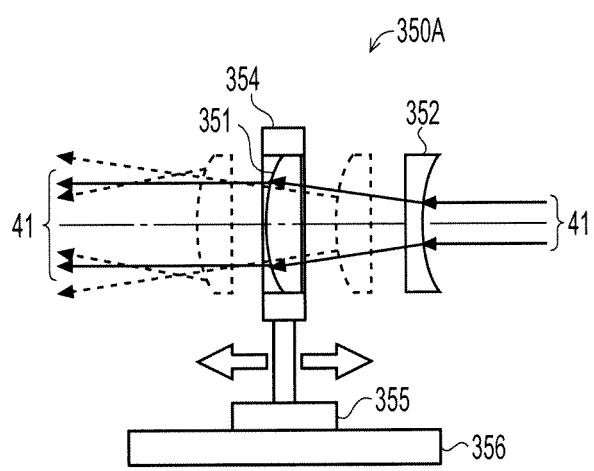
FIG. 23 schematically illustrates an example of a wavefront adjuster including a spherical convex lens and a spherical concave lens.

FIG. 23 schematically illustrates an example of a wavefront adjuster including a spherical convex lens and a spherical concave lens.

As shown in FIG. 23, a wavefront adjuster 350A may include a spherical convex lens 351, a spherical concave lens 352, a lens holder 354, a moving plate 355, and a single-axis moving mechanism 356. The spherical convex lens 351 may be held by the lens holder 354. The spherical concave lens 352 may be held by another lens holder (not separately shown). The lens holder 354 may be fixed to the slidable moving plate 355. The single-axis moving mechanism 356 may be configured to move the spherical convex lens 351 together with the moving plate 355 and the lens holder 354 along the beam axis of the pre-pulse laser beam 41. The single-axis moving mechanism 356 may operate under the control of the EUV light generation control device 51.

Figure 24:
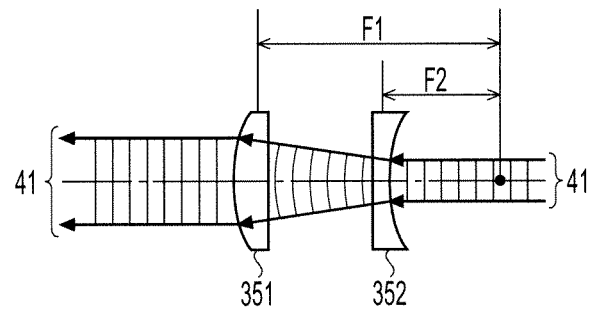
FIG. 24 shows an example of a wavefront of a pre-pulse laser beam when the focal position of the spherical convex lens and the focal position of the spherical concave lens shown in FIG. 23 coincide with each other.
Figure 25:
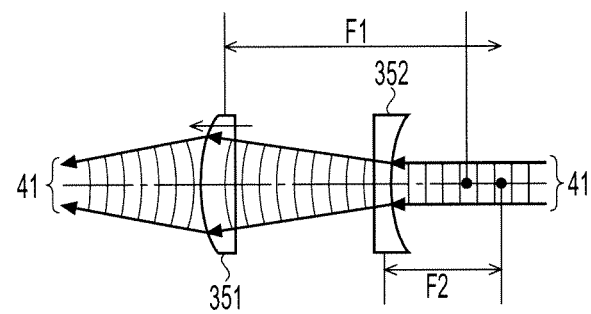
FIG. 25 shows an example of a wavefront of a pre-pulse laser beam when the distance between the spherical convex lens and the spherical concave lens shown in FIG. 23 is increased from the state shown in FIG. 24.
Figure 26:
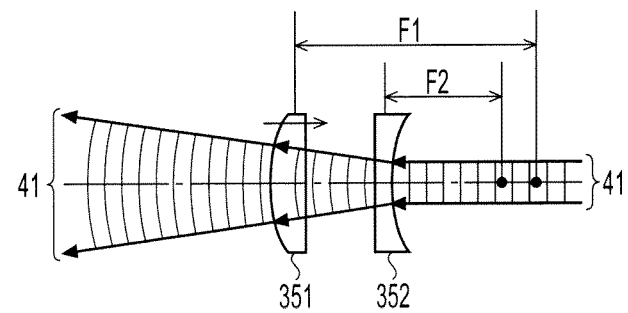
FIG. 26 shows an example of a wavefront of a pre-pulse laser beam when the distance between the spherical convex lens and the spherical concave lens shown in FIG. 23 is decreased from the state shown in FIG. 24.

FIG. 24 shows an exemplary wavefront of the pre-pulse laser beam 41 when the focus of the spherical convex lens 351 coincides with the focus of the spherical concave lens 352. FIG. 25 shows an exemplary wavefront of the pre-pulse laser beam 41 when the distance between the spherical convex lens 351 and the spherical concave lens 352 is increased from the state shown in FIG. 24. FIG. 26 shows an exemplary wavefront of the pre-pulse laser beam 41 when the distance between the spherical convex lens 351 and the spherical concave lens 352 is decreased from the state shown in FIG. 24.

As shown in FIG. 24, when the focus of the spherical convex lens 351 coincides with the focus of the spherical concave lens 352, the collimated pre-pulse laser beam 41 incident on the spherical concave lens 352 may first be expanded and then collimated again through the spherical convex lens 351. Meanwhile, as shown in FIG. 25, when the distance between the spherical convex lens 351 and the spherical concave lens 352 is increased from the state shown in FIG. 24, the wavefront of the pre-pulse laser beam 41 outputted from the spherical convex lens 351 may be concave. Thus, the pre-pulse laser beam 41 outputted from the wavefront adjuster 350A may be a converging beam having a focus in its travel direction. Further, as shown in FIG. 26, when the distance between the spherical convex lens 351 and the spherical concave lens 352 is decreased from the state shown in FIG. 24, the wavefront of the pre-pulse laser beam 41 outputted from the spherical convex lens 351 may be convex. Thus, the pre-pulse laser beam 41 outputted from the wavefront adjuster 350A may be a diverging beam having a focus in the direction opposite to its travel direction.

In this way, when the wavefront adjuster 350A includes the spherical convex lens 351 and the spherical concave lens 352, adjusting the distance between the spherical convex lens 351 and the spherical concave lens 352 enables to control the wavefront of the pre-pulse laser beam 41 outputted from the wavefront adjuster 350A.

5.2 Combination of Two Spherical Convex Lenses

Figure 27:
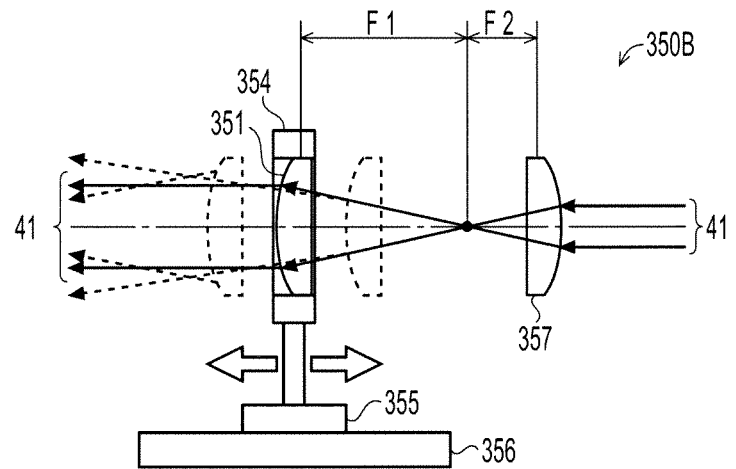
FIG. 27 schematically illustrates another example of a wavefront adjuster including two spherical convex lenses.

In another example, two spherical convex lenses may be combined, as shown in FIG. 27. FIG. 27 schematically illustrates an example of a wavefront adjuster including two spherical convex lenses.

As shown in FIG. 27, a wavefront adjuster 350B may include two spherical convex lenses 351 and 357, the lens holder 354, the moving plate 355, and the single-axis moving mechanism 356. The spherical convex lens 351 may be held by the lens holder 354. The spherical convex lens 357 may be held by another lens holder (not separately shown). The lens holder 354 may be fixed to the slidable moving plate 355. The single-axis moving mechanism 356 may be configured to move the spherical convex lens 351 together with the moving plate 355 and the lens holder 354 along the beam axis of the pre-pulse laser beam 41. The single-axis moving mechanism 356 may operate under the control of the EUV light generation control device 51.

Even with such a configuration, adjusting the distance between the two spherical convex lenses 351 and 357 enables control of the wavefront of the pre-pulse laser beam 41.

5.3 45-Degree Incidence VRM

Figure 28:
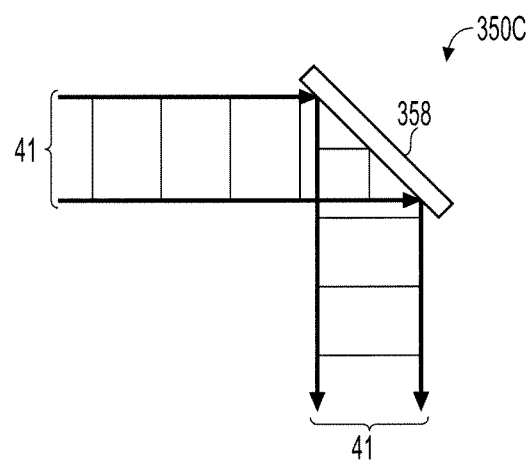
FIG. 28 schematically illustrates another example of a wavefront adjuster including a variable radius mirror (VRM).
Figure 29:
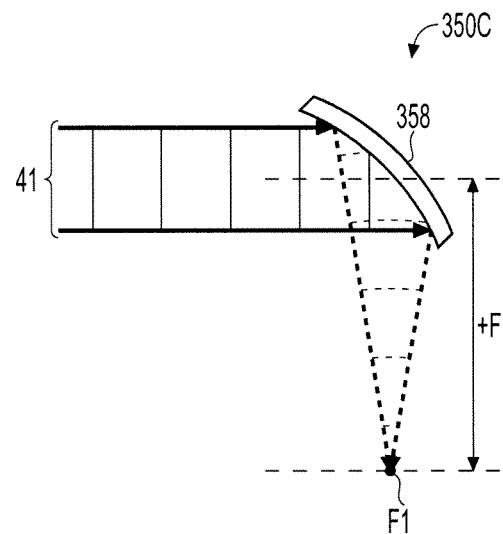
FIG. 29 schematically illustrates the wavefront adjuster shown in FIG. 28 in one operation state.
Figure 30:
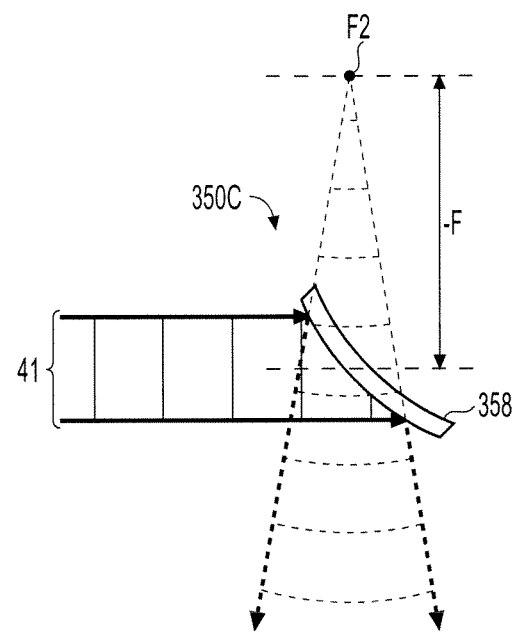
FIG. 30 schematically illustrates the wavefront adjuster shown in FIG. 28 in another operation state.

FIGS. 28 through 30 schematically illustrate an example of a wavefront adjuster including a variable radius mirror (VRM). A wavefront adjuster 350C may include a deformable mirror 358. The deformable mirror 358 may reflect the collimated pre-pulse laser beam 41 incident thereon as a collimated laser beam when the reflective surface thereof is flat, as shown in FIG. 28. The deformable mirror 358, meanwhile, may reflect the collimated pre-pulse laser beam 41 incident thereon as a converging laser beam which is focused at a predetermined focus F1 distanced from the deformable mirror 358 by a focal distance +F, when the curvature of the reflective surface of the deformable mirror 358 is adjusted to be concave, as shown in FIG. 29. Alternatively, the deformable mirror 358 may reflect the collimated pre-pulse laser beam 41 incident thereon as a diverging laser beam which has a virtual focus F2 distanced from the deformable mirror 358 by a focal distance −F, when the curvature of the reflective surface of the deformable mirror 358 is adjusted to be convex, as shown in FIG. 30.

In this way, the wavefront adjuster 350C may be configured of the deformable mirror 358 to control the wavefront of the reflected pre-pulse laser beam 41 to a predetermined wavefront.

Figure 31:
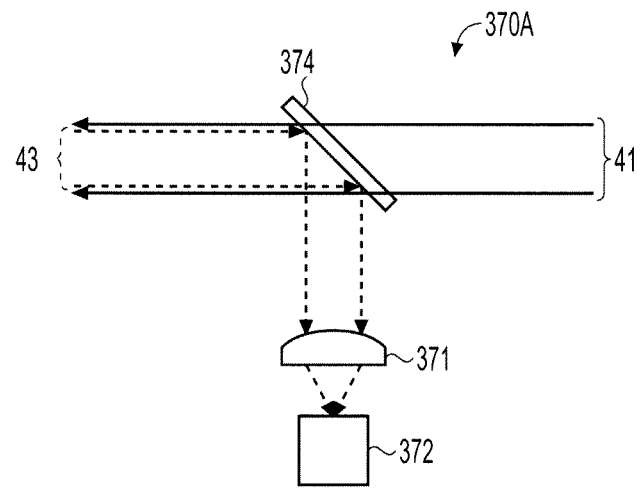
FIG. 31 schematically illustrates an exemplary configuration of an optical detector including an imaging lens and an image sensor.

6. Examples of Optical Detector 6.1 Combination of Imaging Lens and Image Sensor FIG. 31 schematically illustrates an exemplary configuration of an optical detector including an imaging lens and an image sensor. As shown in FIG. 31, an optical detector 370A may include the imaging lens 371 and the image sensor 372. The image sensor 372 may be a two-dimensional sensor, such as a CCD. Further, the optical detector 370A may include the polarization beam splitter 374. In addition, the optical detector 370A may include the wavelength filter 373 (see FIG. 2, 13, or 21).

The backpropagating beam 43 reflected by the polarization beam splitter 374 may be imaged on the photosensitive surface of the image sensor 372 by the imaging lens 371. Thus, an image of a target 27 may be detected by the image sensor 372. When the image of the target 27 is formed on the photosensitive surface of the image sensor 372 in a state where the target 27 is in focus, the focus position of the pre-pulse laser beam 42 and the position of the target 27 may be regarded as coinciding with each other. Thus, the wavefront adjuster 350 may be controlled so that the image of the target 27 is formed on the image sensor 372. Accordingly, the precision with which the target 27 is irradiated with the pre-pulse laser beam 41 may be improved.

6.2 Shack-Hartmann Interferometer

Figure 32:
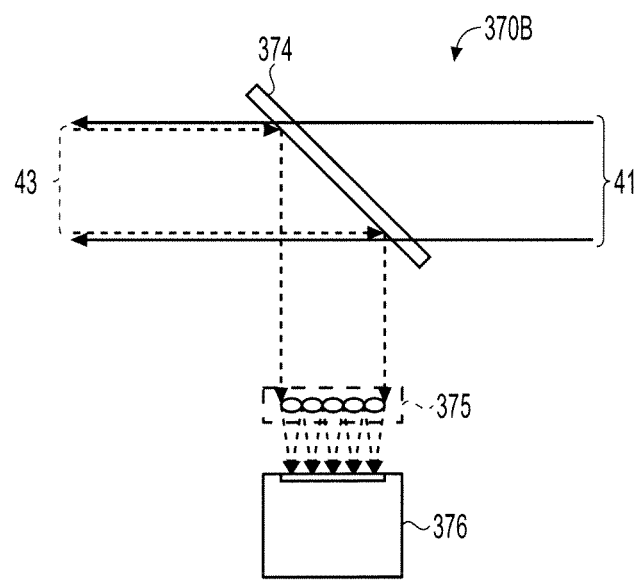
FIG. 32 schematically illustrates an exemplary configuration of an optical detector including a Shack-Hartmann interferometer.

FIG. 32 schematically illustrates an exemplary configuration of another optical detector including a Shack-Hartmann interferometer. As shown in FIG. 32, an optical detector 370B may include a microlens array 375 and a wavefront sensor 376. The wavefront sensor 376 may be a two-dimensional sensor, such as a CCD. Further, the optical detector 370B may include the polarization beam splitter 374. In addition, the optical detector 3703 may include the wavelength filter 373 (see FIG. 2, 13, or 21).

The backpropagating beam 43 reflected by the polarization beam splitter 374 may be imaged on the photosensitive surface of the wavefront sensor 376 by the microlens array 375. Then, the wavefront sensor 376 may detect a wavefront of the backpropagating beam 43. Detecting the wavefront of the backpropagating beam 43 may enable detection of which direction the focus position of the pre-pulse laser beam 42 is offset from the position of the target 27 along the direction of the beam axis of the pre-pulse laser beam 42. As a result, the focus position of the pre-pulse laser beam 42 may be adjusted to the position of a target 27 more quickly.

Figure 33:
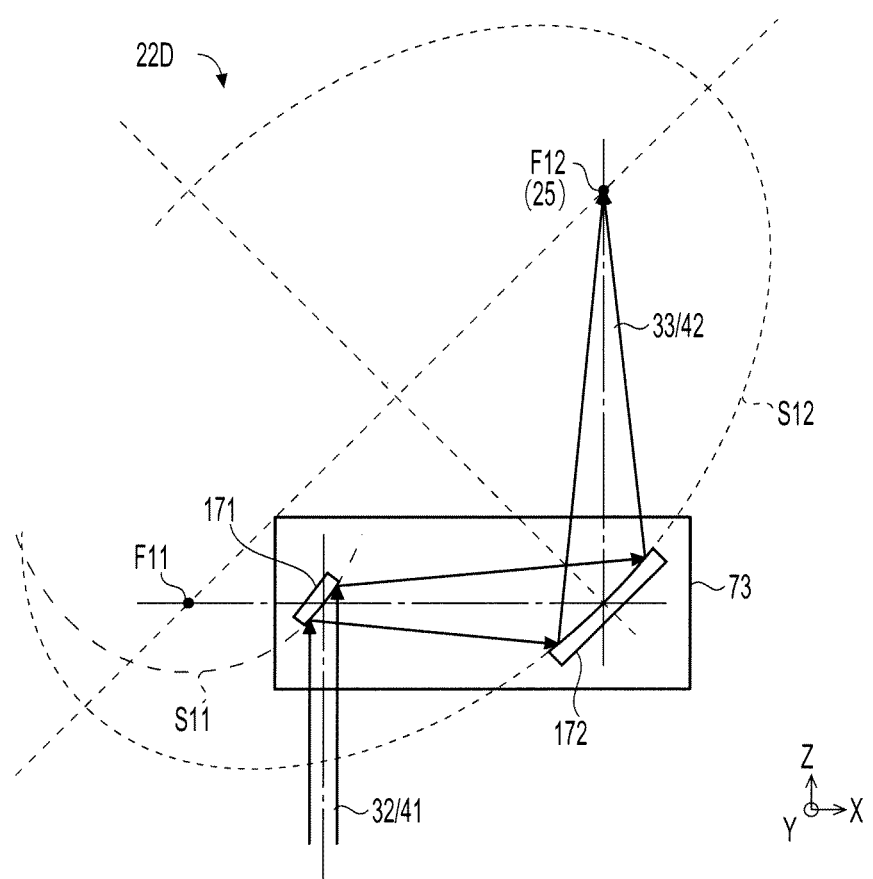
FIG. 33 shows an example of a laser beam focusing optical system including a paraboloidal mirror and a spheroidal mirror.

7. Examples of Laser Beam Focusing Optical System 7.1 Combination of Off-Axis Paraboloidal Mirror and Spheroidal Mirror FIG. 33 shows an example of a laser beam focusing optical system including an off-axis paraboloidal mirror and a spheroidal mirror. As shown in FIG. 33, a laser beam focusing optical system 22D may include an off-axis paraboloidal mirror 171 and a spheroidal mirror 172. The off-axis paraboloidal mirror 171 and the spheroidal mirror 172 may be fixed to the moving plate 73 through respective holders (not separately shown). The moving plate 73 may be movable through the plate moving mechanism 74 (see FIG. 2, 13, or 21).

The off-axis paraboloidal mirror 171 and the spheroidal mirror 172 may be positioned such that the focus of a parabola S11 along the reflective surface of the off-axis paraboloidal mirror 171 and one of the focuses of an ellipse S12 along the reflective surface of the spheroidal mirror 172 coincide with each other at a point F11. Further, the spheroidal mirror 172 may be positioned such that the other focus F12 of the ellipse S12 is located in the plasma generation region 25.

8. Additional Example

Figure 34:
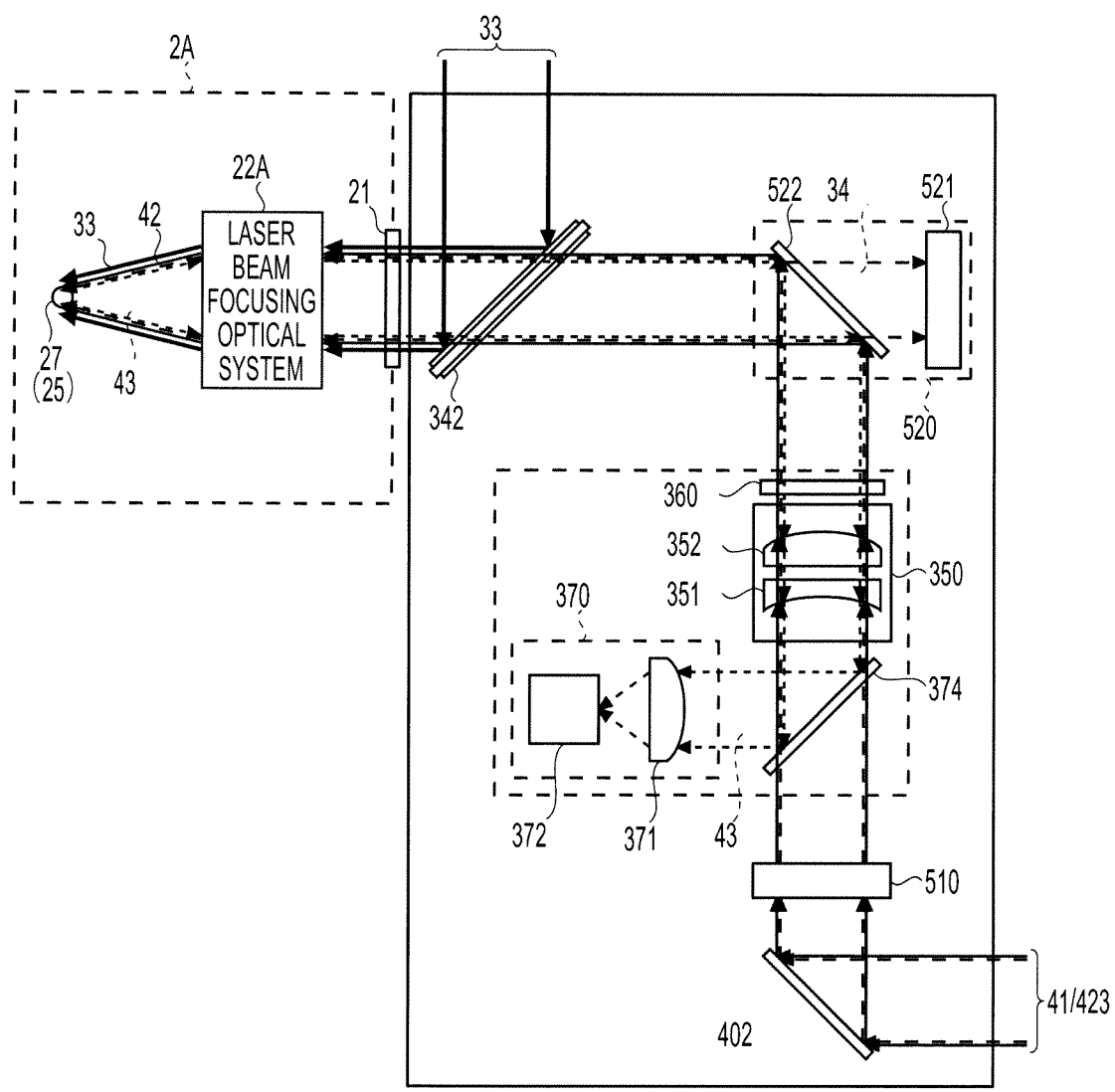
FIG. 34 shows an example of an EUV light generation system including a mechanism for suppressing a backpropagating beam of a main pulse laser beam.

FIG. 34 shows another example where a mechanism for suppressing a backpropagating beam of the main pulse laser beam 33 and a profile adjuster for the pre-pulse laser beam 41 are added to the above-described embodiment(s). FIG. 34 only shows a section where the laser beams enter the chamber 2A.

As shown in FIG. 34, a profile adjuster 510 may be provided in a beam path of the pre-pulse laser beam 41 and/or the guide laser beam 423. For example, the profile adjuster 510 may be provided upstream from the polarization beam splitter 374. The profile adjuster 510 may convert the cross-sectional profile of the pre-pulse laser beam 41 or the guide laser beam 423 into a so-called top-hat profile. This may improve the stability of a state of a diffused target generated from a target 27. Accordingly, the backpropagating beam 43 or 423 may be detected more stably. As a result, the focus position of the pre-pulse laser beam 42 or the guide laser beam 423 may be controlled to the position of a target 27 with higher precision. A diffractive optical element (DOE) may, for example, be used for the profile adjuster 510.

The pulse energy of the main pulse laser beam 33 may sometimes be 100 times greater than the pulse energy of the pre-pulse laser beam 42. A part of the backpropagating beam 34 of the main pulse laser beam 33 reflected by a diffused target may be transmitted through the dichroic mirror 342. In that case, the backpropagating beam 34 may cause damage in an amplifier or other optical elements provided upstream from the beam splitter 342. Accordingly, as shown in FIG. 34, a backpropagating beam prevention mechanism 520 may be provided in a beam path of the pre-pulse laser beam 41 downstream from the optical detector 370 in order to attenuate the backpropagating beam 34 transmitted through the dichroic mirror 342. The backpropagating beam prevention mechanism 520 may include a beam splitter 522 and a beam dump 521. The beam splitter 522 may be coated on a surface thereof with a film configured to transmit the backpropagating beam 34 with high transmittance and reflect the pre-pulse laser beam 41 and the guide laser beam 423 with high reflectance. Providing the backpropagating beam prevention mechanism 520 configured as such may allow the backpropagating beam 34 reflected by a diffused target to be reduced.

For example, when the main pulse laser beam 33 is a $CO_2$ laser beam, the pre-pulse laser beam 42 is a YAG laser beam, and the guide laser beam 423 is a He—Ne laser beam, a gallium arsenide (GaAs) substrate may be used for a substrate of the beam splitter 522.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. A system for generating extreme ultraviolet light, comprising:
a chamber;
a target supply device configured to supply a target material into the chamber;
a laser apparatus configured to output a laser beam to irradiate the target material;
a wavefront adjuster configured to adjust a wavefront of the laser beam;
an imaging optical system configured to focus the laser beam reflected by the target material;
an image detector configured to capture an image of the laser beam focused by the imaging optical system; and
a controller configured to control the wavefront adjuster based on the captured image.

2. A system for generating extreme ultraviolet light, comprising:
a beam path adjuster configured to control a beam path of a first laser beam and a beam path of a second laser beam to substantially coincide with each other;
a wavefront adjuster provided in a beam path of the first laser beam upstream from the beam path adjuster; and
a focusing optical system provided in a beam path of the first laser beam and the second laser beam downstream from the beam path adjuster.

3. The system according to claim 2, further comprising:
an image detector configured to capture an image of a backpropagating beam reflected by a target material and having passed through the focusing optical system and the wavefront adjuster; and
a controller configured to control the wavefront adjuster based on an image obtained by the image detector.

4. The system according to claim 3, wherein the image detector obtains an image of a backpropagating beam of the first laser beam reflected by the target material.

5. The system according to claim 3, further comprising a laser apparatus configured to output a third laser beam to enter the wavefront adjuster along substantially the same beam path as the first laser beam,
wherein the image detector is configured to obtain an image of a backpropagating beam of the third laser beam reflected by the target material.

6. The system according to claim 3, further comprising:
an attenuator; and
a moving unit configured to insert or remove the attenuator into or from a beam path of the first laser beam,
wherein the image detector is configured to obtain an image of a backpropagating beam of the first laser beam reflected by the target material when the attenuator is disposed in the beam path of the first laser beam.

7. The system according to claim 3, wherein the controller is configured to control the wavefront adjuster so that a size of an image of the target material detected by the image detector decreases.

8. The system according to claim 3, wherein the controller is configured to control the wavefront adjuster so that a peak pixel value in the image detected by the image detector increases.

9. The system according to claim 3, further comprising:
a beam splitter configured to separate a beam path of a laser beam other than the backpropagating beam transmitted through the focusing optical system and the wavefront adjuster from a beam path of the backpropagating beam; and
a beam dump configured to absorb a laser beam other than the backpropagating beam separated by the beam splitter.

10. The system according to claim 2, wherein the focusing optical system includes a mirror configured to focus the first laser beam and the second laser beam.

11. The system according to claim 2, wherein the focusing optical system includes a lens configured to focus the first laser beam and the second laser beam.

12. The system according to claim 2, further comprising a profile adjuster provided in a beam path of the first laser beam upstream from the wavefront adjuster configured to convert a profile of the first laser beam into a top-hat profile.

13. A method for generating extreme ultraviolet light in a system which includes a beam path adjuster configured to cause abeam path of a first laser beam and a beam path of a second laser beam to substantially coincide with each other, a wavefront adjuster provided in a beam path of the first laser beam upstream from the beam path adjuster, and a focusing optical system provided in a beam path of the first laser beam and the second laser beam downstream from the beam path adjuster and in which a target material is irradiated with the first laser beam to be turned into a diffused target and the diffused target is irradiated with the second laser beam, the method comprising:
obtaining an image of a backpropagating beam reflected by the target material and having passed through the focusing optical system and the wavefront adjuster; and
adjusting the wavefront adjuster based on the obtained image.

* * * * *